US008400180B2

(12) United States Patent
Roberts

(10) Patent No.: US 8,400,180 B2
(45) Date of Patent: Mar. 19, 2013

(54) TANDEM HANDLER SYSTEM AND METHOD FOR REDUCED INDEX TIME

(75) Inventor: Howard Roberts, Austin, TX (US)

(73) Assignee: Celerint, LLC, New York, NY (US)

( * ) Notice: Subject to any disclaimer, the term of this patent is extended or adjusted under 35 U.S.C. 154(b) by 0 days.

(21) Appl. No.: 12/544,818

(22) Filed: Aug. 20, 2009

(65) Prior Publication Data

US 2009/0309620 A1 Dec. 17, 2009

Related U.S. Application Data

(60) Division of application No. 11/469,817, filed on Sep. 1, 2006, now Pat. No. 7,619,432, which is a continuation-in-part of application No. 10/767,932, filed on Jan. 29, 2004, now Pat. No. 7,183,785, and a continuation-in-part of application No. 11/264,949, filed on Nov. 1, 2005, now Pat. No. 7,508,191.

(30) Foreign Application Priority Data

Jan. 28, 2005 (WO) ................ PCT/US2005/002739
Jan. 12, 2006 (WO) ................ PCT/US2006/001156
Jul. 28, 2006 (JP) ................................. 2006-551503
Jul. 31, 2006 (CN) ...................... 2005 9 0000025 U
Aug. 28, 2006 (EP) ..................................... 05722603

(51) Int. Cl.
*G01R 31/26* (2006.01)
*G01R 31/02* (2006.01)
*G01R 31/20* (2006.01)
*G01R 31/00* (2006.01)

(52) U.S. Cl. .......... 324/762.01; 324/757.01; 324/756.02

(58) Field of Classification Search ........................ None
See application file for complete search history.

(56) References Cited

U.S. PATENT DOCUMENTS 5,650,732 A * 7/1997 Sakai ........................ 324/757.04
5,968,193 A * 10/1999 Ang .............................. 714/724
6,075,358 A 6/2000 Hetzel et al.
6,225,798 B1 5/2001 Onishi et al.

(Continued)

FOREIGN PATENT DOCUMENTS

JP 11-083935 3/1999
JP 2000194412 A * 7/2000

(Continued)

OTHER PUBLICATIONS

Supplementary European Search Report, dated Dec. 6, 2011, for corresponding European Patent Application No. 05722603.

(Continued)

*Primary Examiner* — Roberto Velez
(74) *Attorney, Agent, or Firm* — Greenblum & Bernstein, P.L.C.

(57) ABSTRACT

A system for testing with an automated test equipment (ATE) includes a tester having at least one test resource, a tandem handler, and a mux relay that switchably connects the test resource, via parallel connections, to either one of dual sockets at each instant of testing. The handler has first and second manipulator arms. Each arm operates as to a particular one of the respective sockets, to retrieve a next device to be tested and position the device in the socket (while testing is performed on a device in the other socket), to disposition the device from the socket once testing is completed as to the device in the socket, and thereafter repeat until all staged devices for testing have been tested (or an interruption of testing otherwise occurs). The mux relay switches between sockets in response to the tandem handler acting as a master and the tester as slave. Upon completion of testing via the test resource as to an applicable pin of one socket, the test resource is switchably connected via the mux relay to a functionally same applicable pin of the other socket.

11 Claims, 17 Drawing Sheets

U.S. PATENT DOCUMENTS

| | | | |
|---|---|---|---|
| 6,515,470 B2 * | 2/2003 | Suzuki et al. | 324/750.03 |
| 6,831,454 B2 * | 12/2004 | Bae et al. | 324/756.02 |
| 6,958,617 B1 * | 10/2005 | Rhodes et al. | 324/756.02 |
| 7,196,508 B2 * | 3/2007 | Ham et al. | 324/158.1 |
| 2004/0143411 A1 * | 7/2004 | Wu | 702/117 |
| 2004/0164723 A1 | 8/2004 | Bae et al. | |
| 2005/0168233 A1 | 8/2005 | Roberts et al. | |

FOREIGN PATENT DOCUMENTS

| | | |
|---|---|---|
| KR | 10-0140931 | 7/1998 |
| WO | 03/005041 | 1/2003 |
| WO | WO 03/005041 A3 * | 1/2003 |
| WO | 2005/072406 | 8/2005 |

OTHER PUBLICATIONS

Extended European Search Report from E.P.O. For related European Patent Application, mailed Feb. 21, 2012.

Korean Office Action, mailed Oct. 5, 2012, in counterpart Korean Patent Application.

* cited by examiner

TANDEM HANDLER SYSTEM AND METHOD FOR REDUCED INDEX TIME

CROSS-REFERENCE TO RELATED APPLICATIONS

The present application is related to and is a divisional of U.S. patent application Ser. No. 11/469,817, titled "Tandem Handler System and Method for Reduced Index Time, filed Sep. 1, 2006, now U.S. Pat. No. 7,619,432 of the same inventor hereof and co-pending herewith, which is a continuation-in-part of: U.S. patent application Ser. No. 10/767,932, titled "Test System and Method for Reduced Index Time", filed Jan. 29, 2004 (now issued as U.S. Pat. No. 7,183,785), of the same inventor hereof and which was co-pending with the parent application of this present divisional; and U.S. patent application Ser. No. 11/264,949, titled "Pin Electronics Implemented System and Method for Reduced Index Time", filed Nov. 1, 2005 (now issued as U.S. Pat. No. 7,508,191), of the same inventor hereof and which was co-pending with the parent application of this present divisional; and each of those applications is incorporated herein.

BACKGROUND OF THE INVENTION

The present invention generally relates to automated manufacture systems and methods and, more particularly, relates to automated and robotic semiconductor equipment systems and methods, particularly for testing and quality control, and improvements thereto, including reduction of index timing delays and the like.

Automated manufacturing equipment has streamlined the manufacturing process in many industries. Moreover, such automation has increased reliability and results. A downside of automation has been timing delays in equipment operations. Particularly, where expensive manufacturing equipment is involved, delays in operations of the equipment, such as during mechanical movements in transferring devices under test, limit returns on the costs of such equipment because of idle or non-testing use periods during mechanical manipulations, resets, and the like. An impetus in manufacturing technology and operations has, therefore, been to limit times in which costly test equipment is idle and not performing the applicable test function, for example, when robotically substituting next test pieces.

In semiconductor manufacture, semiconductor device test equipment is a costly capital requirement. Conventionally, such test equipment has included a robotic manipulator for handling the devices being tested. This robotic manipulator system is commonly referred to as a "handler" and is typically configured with one or more robotic arms referred to as "manipulators." The manipulator mechanically picks up a device for testing, inserts the device into an interface test board socket and issues a start-of-test signal to the tester. The tester then conducts a test on the device and returns a test result and an end-of-test signal to the handler which causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace it with the next device(s) to be tested, the tester remains substantially idle. This idle time, sometimes referred to as the "index time" for the particular tester and system, involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manipulation equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would, therefore, be a significant improvement in the art and technology to further reduce index time involved in test operations in manufacturing environments. Particularly in semiconductor manufacture, economic and other gains and advantages are possible if index times are reduced in the testing of semiconductor devices. It would also be an improvement to provide new and improved systems and methods for achieving reduced index times, without requiring substantial changes or new developments in existing mechanical operations of device handlers and similar robotic or automated components for the testing.

For purposes of background understanding, conventional testing systems and operations are now described:

Referring to FIG. 1, a conventional system 100 for testing a device 102 (also referred to herein as "device under test" and/or "DUT") includes a tester 104, an interface board 106 connected to the tester 104 that makes available the tester 104 resources (e.g., testing protocols, signals, and procedures run by the tester) to the device 102 under test, and a robotic handler 108. It is to be understood that the device 102 can be a single device or multiple devices simultaneously connected to the tester and tester resources for concurrent testing operations, but that the singular term "device" is used herein to refer to devices that are so simultaneously connected and concurrently tested. The robotic handler 108 is communicatively connected to the tester 104. The interface board 106 is communicatively connected to the tester 104. The interface board 106 includes a test socket 110 for receiving and maintaining the device 102 during testing.

The test socket 110 provides a physical mechanism that assists a manipulator arm 109 of the handler 108 in the alignment of the device 102 under test, so that electrical contact between the device 102 under test and the tester 104 is adequately maintained while the device 102 is undergoing electrical test. Typically the precision of the manipulator arm 109 is too course to (itself alone) provide and maintain proper electrical contact between the device 102 under test and the tester 104 and relevant tester resources, and it is the test socket 110 which provides the mechanics of fine alignment required to maintain proper electrical contact during test. It is also to be understood that the test socket 110 can be a single socket for device(s) or multiple sockets for device(s) simultaneously manipulated, retained, and transferred or positioned for testing by the manipulator arm 109 of the robotic handler 108 in each successive manipulation of next device(s) to be tested.

For example, in certain configurations, a chuck (i.e., device retention mechanism) of the manipulator arm 109 can pick up more than one device (e.g., two devices in the same pass of the manipulator arm 109) for testing, and then position each of the devices at respective sockets available for the devices. The respective sockets in such configuration are physically connected in parallel to the tester 104 (and its test resource), but the tester 104 (and test resource) electrically connects at any instant only to one socket (and one device therein) in performing each separate test. After testing of one socket (and one device therein), the chuck, as applicable in the configuration, either posits the next device for testing in another respective socket for this next device and tests via that respective socket because of the parallel electrical connectivity of that socket; or removes the tested device from the one socket and places the next device in that same socket for the test via that same socket of the next device.

Furthermore, in certain other configurations, a single interface board can have more than one test socket and the sockets are not connected in parallel (i.e., not parallel for purposes of concurrent use of same tester resource), but the tester 104 has a separate respective distinct tester resource connected to each socket, respectively. Such multiple sockets on the interface board are each connected only to the respective distinct (different) tester resource from the single tester 104. In effect, the tester 104 can perform different tests on each socket, but not the same tests on each socket concurrently. In such configurations, the chuck of the manipulator arm 109 can similarly pick-up, position and locate in the sockets more than one device in each pass of the manipulator arm 109 (e.g., two devices in the pass of the arm 109). Nonetheless, the different tests are performed as to the respective distinct sockets, not the same test at once. For purposes herein, the singular term "socket" is intended and to be understood as including this type of configuration (of more than one socket), as well.

There can be certain other special cases of configurations, where the tester resources can drive signals from the tester to multiple devices (in multiple respective sockets) at the same time. Such resources include power supplies, digital drivers, and analog waveform generators. In each special case, however, the resource is considered an output resource from the particular tester, and the tester in such use must be specially configured and have functionality required to perform the separate distinct testing in concurrent manner. Most conventional testers do not have such special configuration or functionality and, in any event, any such special testers can be significantly more expensive and/or limited in application when compared to most conventional testers. For purposes herein, the singular term "socket" also means and includes the multiple socket arrangement for this type of special case of tester with such capabilities.

As is typical, the robotic handler 108 in each of the foregoing configurations mechanically moves and operates to pick up and handle the device 102 (i.e., which, as just discussed, can actually be more than one device depending on chuck, arm, and handler design and capabilities), from among one or more devices to be tested. Once the device 102 to be tested is picked-up by the manipulator arm 109 of the handler 108, the handler 108 controls the manipulator arm 109 to transfer the device 102 into position in the appropriate socket 110 of the interface board 106 (i.e., which socket, socket, can similarly actually be more than one socket either in parallel or as with the special case tester, depending on design and capabilities as have just been discussed). The tester 104 then commences to test the device 102. After the test is completed by the tester 104, the handler 108, via the control of the manipulator arm 109 and its operation, mechanically removes the device 102 from the socket 110 and transfers the device 102 to a location of tested devices.

In operations of the conventional system 100, a set of devices to be tested are staged at the input to the handler 108 by a human operator. The operator then instructs the handler 108 to begin retrieving devices to be tested and to stage the next available device by inserting it into the test socket 110. Once the handler 108 has sensed that the first device 102 is in place in the test socket 110 and ready for test, the handler 108 issues a start-of-test signal to the tester 104. In response to the start-of-test signal, the tester 104 executes a test program that electrically stimulates, via the test socket 110, the device 102 under test and measures the output response from the device 102. The tester 104 compares the output response to a set of expected response data and judges the results as either a "pass" or a "fail" of the device 102.

If the interface board contains multiple test sockets and the tester is capable of concurrent testing with different tester resources of the tester, as with the certain specialized tester previously mentioned, the tester must query the handler status to determine which test sockets have devices ready for test and which do not. The tester can then ignore failing test results from empty test sockets and test only active test socket sites with devices inserted. Of course, as previously mentioned, such special testers with these capabilities are relatively uncommon, expensive, and limited in application.

Once the test program has concluded testing for the device 102 and a pass/fail determination of the test results has been made by the tester 104, the tester 104 communicates back to the handler 108 the test result data for the device 102 just tested and follows by an end-of-test signal to the handler 108. The handler 108 receives the end-of-test signal from the tester 104, and the handler 108 uses the test results data to disposition the device 102 just tested by control and operations of the manipulator arm 109 of the handler 108, into an output staging area for tested devices, such as separate holding areas for passing devices and for failing devices, respectively.

If the interface board contains multiple test sockets and the tester is capable of concurrent testing with different tester resources of the tester, as with the certain specialized tester previously mentioned, the tester must communicate results data for each of the active test socket locations that is site specific and the handler must disposition each of the devices accordingly. Again, any such arrangement requires specialized tester and possibly special handler equipment, and these each have the problems of expense and limited applications.

In ongoing operations of the system 100, once the handler 108 has dispositioned the device 102 just tested, the process repeats in succession until there are no additional untested devices remaining to be tested, or until any error condition in the handler status or tester halts operation, or until a human operator intervenes to halt the testing.

In each case of a test in this conventional system 100, the handler 108 individually obtains and transfers the respective device 102 then being tested. During the mechanical operations of the handler 108 (and, in particular, the manipulator arm 109 thereof) in picking up, setting in the socket 110, and locating after test, the tester 104 remains idle without conducting any test. The index time for the system 100 is substantially the time required for the mechanical operations of the handler 108 when removing and dispositioning the tested device and then retrieving and inserting each next successive untested device for testing. The index time also includes any time interval between the end-of-test signal from the tester 104 to the handler 108 and the next start-of-test signal from the handler 108 to the tester 104.

Referring to FIG. 4, a conventional process 400 for testing a device includes a step 402 of initiating a first manipulator. In the step 402, for example, a signal is communicated to a robotic handler having the first manipulator. The signal is communicated by a tester or other source, to indicate to the handler that the first manipulator should initiate actions to obtain and locate a device for testing. The device is, for example, a semiconductor device or any other manufactured part or element that is to be tested by the particular tester.

In a step 404, the first manipulator mechanically moves its arm to retrieve a first device for testing. The first manipulator grips or otherwise retains the first device. Then, in a step 406, the first manipulator mechanically picks-up and manipulates the first device, for example, appropriately orienting the first device for testing. In a step 408, the first manipulator mechanically moves the first device to an interface board connected to the tester and inserts the first device in a socket or other test cell of the interface board.

Once the first device is located in the socket or other test cell, the tester commences a step 412 of testing of the device. Testing can include power test, logic test, and any of a wide variety of other quality control or device conformance tests. The testing may take some period of time for completion, depending on the test being performed. During the testing, the first manipulator maintains the first device in position at the interface board for the test.

When the testing step 412 is completed, the tester signals to the handler and the first manipulator is activated to mechanically remove the device, in a step 414, from the socket or other test cell. The first manipulator then moves the first device to a desired post-test location in a step 416. In a step 418, the first device is released by the first manipulator at the post-test location.

The process 400 then returns to the step 402, in order to repeat the steps with respect to a next test device and a next test of the device. As previously mentioned, the time during the process 400 required for the operations of the first manipulator of the handler to pick-up, move, place, remove and dispense of each device, is referred to as the "index time" for the test system. During the index time of operations of the first manipulator, the tester remains in an idle state in which no test is being conducted. The index time that is required in such process 400 delays and limits the entire process 400.

Referring to FIG. 13, conventional testers include pin electronics cards 1302 that provide for the various tests performable by the tester, both analog and/or digital. Each pin electronics card 1302 contains one or more test resources, represented by the blocks 1302*a-c*. The test resources of each pin electronics card 1302 can include different, more, less or other elements from those of blocks 1302*a-c*, which are solely for example purposes, including, without limitation, such as the following:

1. a driver that drives a voltage to an input pin (or pad) on the device under test ("DUT");
2. a receiver or comparator that measures the voltage on an output pin (or pad) of the DUT;
3. a current load of a 50 Ohm resistive connection to a variable termination voltage and current clamps which change the 50 Ohm resistance to whatever is required to hold the current load at a fixed and programmable value;
4. memory that stores data states (drive and receive), timing, and voltage thresholds;
5. a controller that sequences the drive and receive data to and from the DUT at a programmed rate;
6. fail memory that stores information on when the expected data does not match the actual data measured by the receivers;
7. software that manages the operation of the pin electronics of the card, individually and in synchronization with other tester resources; and
8. a calibration system that measures the length of the communication connection from the pin electronics to the DUT resources on the corresponding pin on the DUT.

The pin electronics of the card 1302 can also include test hardware of an analog nature, such as analog to digital converters, digital to analog converters, and time measurement systems. The particular types of test resources of the card 1302 enable testing of the device under test ("DUT") by the tester.

Each pin electronics card 1302 includes test resources for one or more tester channels 1304, each tester channel 1304 serving to test, typically, at a single pin of the DUT. As previously mentioned, there are certain special configurations or functionalities where tester resources could drive signals from the tester to multiple pins at the same time; but most conventional testers do not have this capability and, in any event, the capability is significantly more expensive and quite limited in application. So, for purposes of discussion and understanding, the typical circumstance of test resources that drive a single pin of a single device, via a tester channel connected to the single pin of the device, is described herein. (It should be understood, however, that even if a "special capability" situation is presented, the presently disclosed embodiments will provide advantages as those skilled in the art will know and appreciate.)

Referring to FIG. 14, in conjunction with FIG. 13, another functional representation of the foregoing shows various pin electronics cards 1402, each including various respective test resources 1402*a-d*, with the separate respective tester channel 1404 connecting the applicable test resources 1402*a-d* to a single pin of a DUT (not shown in detail).

Referring to FIG. 15, conventional testers have pin electronics cards that include relays, such as the AC Relay of the exemplary pin electronics card 1500. The AC Relay, for example, electrically disconnects the test resources of the pin electronics card provided over the tester channel 1504, from a single pin of a DUT (not shown in detail) to which the tester channel 1504 is connected.

Referring to FIG. 18, a conventional test system 1800 (presented in somewhat more detail as an example configuration) includes a handler 1802 of a test cell 1803, and an automated test equipment ("tester", also known as "ATE") 1806. The handler 1802 of the system 1800 includes various mechanical (typically physically moving) conveyors/transports and robotic manipulation arms, and respective elements, for positioning and dispositioning respective DUTs in testing successive DUTs. For example, DUTs are positioned for testing at input trays 1820 capable of holding pluralities of to-be-tested DUTs. An input manipulator 1822 of the system 1800 moves successive ones of the to-be-tested DUT (or successive pairs or other number of DUTs) from the input trays 1820 to an input stage 1810 of the system 1800. The DUT is positioned at the input stage 1810 for transport to and through the test cell 1802 in testing of the DUT. The test cell 1802 can include various processing units, such as temp soak and hold stages 1812 (and the like or other pre-test and/or post-test units/prepping).

The test cell 1802 is equipped with a core 1814. The core 1814 includes, among other electrical interfacing and connecting elements, an electrically stimulatable socket 1808.

The socket 1808 has pin connectors to respective test resources of the tester 1806. Respective pins/connectors of the socket 1808 correspond to the electrical input/output pins for the DUT located in appropriate position in the socket 1808 for testing. (As previously mentioned, possibly more than one socket and DUT therein are concurrently testable via a particular test resource(s) in certain configurations of handler and tester, if applicable; however, such configurations and systems are not generally practical or feasible and have not been widely employed as a result of limitations, problems, impediments and the like). The to-be-tested DUT is, thus, positionable (as hereinafter further detailed) in the socket 1808 for testing by the tester 1806. The tester 1806 of the system 1806 performs testing on a posited DUT of the socket 1808, via a particular respective tester resource of the tester 1806 at each corresponding pin of the DUT so positioned in the socket 1808. Tests conducted by the tester 1806, via each respective test resource, accord to the test protocols and capabilities of the tester 1806 for the particular test then conductable via the system 1800.

As previously mentioned, the handler 1802 includes a core manipulator 1804 (i.e., "manipulator arm"). The core manipulator 1804 of the handler 1802 positions each next to-be-tested DUT in the socket 1808 for testing of the DUT by the tester 1806. The core manipulator 1804 must robotically, mechanically operate as to each next to-be-tested DUT by obtaining the DUT, for example, the core manipulator 1804 retrieves the DUT at the temp soak and hold stage 1812, and then positions the DUT for testing, such as into an empty socket 1808 of the core 1814. Once the handler 1802, via operations of the core manipulator 1804 in retrieving/positioning the DUT, senses that the DUT is in place in the socket 1808 and ready for test, the handler 1802 triggers a start-of-test by signaling to the tester 1806. In response, the tester 1806 executes a test program according to the test protocol for the test then-being conducted. In the test, the tester 1806 electrically stimulates, via the socket 1808 at each pin and respective test resource for the pin, the DUT in the socket 1808 and measures output response. Upon completion of the test by the tester 1806 for the DUT then in the socket 1808, the tester 1806 communicates end-of-test result to the handler 1802. The core manipulator 1804 is controlled by the handler 1802 to then disposition the DUT from the socket 1808 and locate the DUT in an applicable disposition stage 1816 of the handler 1802 (with such dispositioning operation of the core manipulator 1804, and the particular applicable disposition stage 1816, corresponding to a pass/fail result of the test and as has then been indicated to the handler 1802 for the particular DUT).

The DUT which has then been tested by the tester 1806 and so dispositioned from the socket 1808, progresses by transport mechanism of the handler 1802, for example, to an output stage 1818. An output manipulator 1824 further progresses the then-tested DUT from the output stage 1818, to a corresponding bin tray 1826 for the DUT. For example, the tested DUT is positioned as output of the handler 1802, and the system 1800, in accordance location in accordance with the test result obtained for the DUT.

Thereafter, to continue testing of a next to-be-tested DUT (from among remaining ones of the DUTs staged as input for testing), the core manipulator 1804 obtains any next successive to-be-tested DUT that is then located (via operations of the input manipulator and transport of the handler 1802) at the temp soak and hold stage 1812 (or otherwise if and as applicable, per the system 1800 test operation). This next DUT is positioned by the core manipulator 1804 in the socket 1808 of the core 1814, and test by the tester 1806 next performed via the socket 1808 on that then-posited DUT at the socket 1808. Upon test completion of this DUT, the core manipulator 1804 next dispositions that then-tested DUT from the socket 1808 and moves this DUT to the disposition stage 1816 for further progression of post-test handling via the handler 1802. The handler 1802 input progression of respective to-be-tested DUTs, positioning/disposition by the core manipulator 1804 of each successive DUT in the socket, and output progression of the DUT on test completion, continues until all DUTs are tested (or until a shutdown, error or other interruption occurs).

In effect, upon test commencement during successive testing of DUTs via the test cell 1802, the tester 1806 acts as a slave and the handler 1802 acts as a master in controlling a testing process. That is, the handler 1802, via the core manipulator 1804, mechanically moves each successive DUT to position it in the socket 1808 for testing and dispositions it from the socket 1808 after testing on it is completed. When the DUT is posited in the socket 1808, the handler 1802 signals the tester 1806 to commence the applicable test (i.e., via the tester resources on resource channels to the socket 1808 and therein posited DUT). As is conventional, the handler 1802, via the core manipulator 1804 and other functional elements of the handler 1802 and system 1800 as may be applicable (e.g., input stage 1810, temp soak and hold 1812, core 1814, disposition 1816, output stage 1818, and associated transports), moves/transports each DUT through applicable stages/procedures required to position, test, and disposition, according to the relevant process protocols and steps and generally as herein so described.

The tester 1806, as previously discussed, connects a single test resource to the pin of the socket 1808 at any instant of testing. For example, whenever the DUT is located in the socket 1808, the tester 1806 conducts testing via the single test resource at the pin, and thereby electrically on the DUT through connection to the pin in the socket 1808. Each respective to-be-tested DUT must, therefore, be successively located in the socket 1808, electrically connecting applicable pin(s), for testing by the tester 1806 (and each test resource thereof that is applicable and corresponding to the respective applicable pin(s)). In so locating each next respective to-be-tested DUT in the socket 1808, and then dispositioning each one from the socket 1808 upon tester 1806 test completion, the core manipulator 1804 operates through a series of steps/movements, and repeats these over and over, until all DUTs are tested. Particularly, the core manipulator 1804 as to each next to-be-tested DUT must robotically proceed to retrieve the next to-be-tested DUT (such as at the temp soak and hold stage 1812), position the DUT at the socket 1808, and posit the DUT in the socket 1808. Once testing of the DUT in the socket 1808 by the tester 1806 (and its respective test resource at each pin) is completed, the handler 1802, via the core manipulator 1804, must further proceed to robotically remove the DUT from the socket 1808 and robotically reposition it elsewhere (such as the disposition stage 1816) for the next successive operations of testing on next DUT in the process of the system 1800. Of course, prior to performing any active test by the tester 1806 as to each next to-be-tested DUT, the core manipulator 1804 (and handler 1802 as a whole) must have previously dispositioned any DUT remaining in the socket 1808, such as from the immediately prior test operation. Only thereafter can the handler 1802, via the manipulator arm 1804, then continue the testing operations by robotically proceeding to obtain and then position the next to-be-tested DUT in the socket 1808, and so forth, on and on until all DUTs are tested or the operations are otherwise halted.

Of course, once each next one of to-be-tested DUT has been positioned in the socket 1808, a next testing is then performed on that next DUT by the tester 1806 and each test resource thereof corresponding to the respective pin. Time lapse occurs between active testing by the tester 1806 on successive DUTs, during the time required for the core manipulator 1804 to obtain and position a next to-be-tested DUT in the socket 1808, and then to disposition the tested DUT from the socket 1808, and on as to each next successive to-be-tested DUT with repetition of these time lapse periods of active testing. Further, during active testing by the tester 1806 on any DUT then posited in the socket 1808 at any instant—i.e., when the DUT is located in the socket 1808 and a respective test resource electrically stimulates its corresponding pin (upon posit/active test/before disposit)—the core manipulator 1804 remains occupied in handling the DUT then-being tested by the tester 1806. The core manipulator 1804, therefore, remains occupied in operating with the then-being tested DUT, and time is required for dispositioning, next positioning, next test, next dispositioning and onward repetition. In effect, in the conventional system 1800 operations, either the tester 1806 is substantially idle and not actively testing at instants that the core manipulator 1804 is active, or when the tester 1806 is actively testing, the core manipulator 1804 is occupied handling the DUT then under test or with of that DUT through testing positioning/test/disposition rather than any progression of next DUT for testing.

Time periods of idle active testing and occupied/in-use core manipulator 1804, therefore, aggregate to significant index time losses in testing operations of the system 1800. The periods of inactivity of testing by the tester and of the occupied/in-use core manipulator/handler elements during positioning/test/dispositioning, are experienced as to each DUT and each successive DUT. When multiple DUTs are tested, as is the usual application (in fact, large numbers of DUTs are typically tested in continuing operations), each component of index time causes non-optimal equipment utilization and longer times to test operations completion for the multiple DUTs. Thus, the conventional system 1800, and its elements and operations of the handler 1802 (and core manipulator 1804 thereof) of the system 1800, coupled with the interruption of active test conduct by the tester 1806 during those core manipulator operations with successive DUTs, has adverse implication to test operations time, equipment use optimization, and entire test process.

As has been disclosed in the related and/or incorporated applications to the present application and as further disclosed herein, the conventional designs of testers (ATEs) and pin electronics cards and also of handlers and handler operations results in undesired index time occurring in the testing process. This application and the related/incorporated applications disclose certain problems primarily resulting in undesired index time because each tester channel of the tester 1806 can connect a respective tester resource to only the single pin of a DUT then being tested at any instant (and the consequence thereof that handler operations must therefore interrupt between active testing of successive DUTs by the tester for periods required for progression from disposit of DUT to posit of each next respective DUT in the handler and tester master/slave operations).

Additionally, as further disclosed in this application, in conjunction with and as also pointed out in the related/incorporated applications, certain problems primarily resulting in undesired index time because of occupied/in-use handler elements/features, including manipulator arms of the handler and also other aspects of the handler such as each single path for processing (i.e., single input stage, single temp soak and hold stage, single disposition and output stage, as well as single transport mechanisms into, through and from test cell and the like) are addressed in order optimize and improve testing systems and test operations and processes, including those of the handler elements and others.

Furthermore, certain other problems of conventional testing systems and processes primarily resulting in downtime because of mechanical and other malfunction and maintenance of the handler, and stages, processes, and elements of the handler (including, but not limited to, manipulator arm and other stages) are addressed by the present disclosure.

From the foregoing description of the conventional system and method for testing devices, it can be readily appreciated and understood that reductions of index time required in the conventional system and method would provide significant advantages. Moreover, it can be appreciated and understood that any reductions that require any previously known specialized tester and handler equipment can be inordinately expensive and limited in application.

Further from the foregoing, it can be readily appreciated and understood that delays and idle test equipment, such as because of handler malfunction, maintenance, or other similar reason, are problematic. Significant advantages would be achieved by reducing the occurrence and possibility for these problems.

The present invention provides these and other advantages and improvements, including improvements and nuances in the foregoing respects, without problems and disadvantages previously incurred in conventional practice, systems, and operations.

SUMMARY OF THE INVENTION

An embodiment of the invention is a system for testing a first device under test (DUT) and a second DUT. The system includes a tester that provides a tester resource for a distinct test. The tester resource is independently/segregatedly connectable to either the first DUT or the second DUT, in parallel configuration of respective sockets therefore. The system includes a handler, including a first positioner and a first unit and a second positioner and a second unit, the handler manipulates the first DUT to the first unit and the handler manipulates the second DUT to the second unit, a relay connected to the handler and the tester, a first socket connectable by the relay to the tester resource for the distinct test by the relay, the first positioner of the handler manipulates the first DUT from the first unit to the first socket for the distinct test, and a second socket connectable by the relay to the tester resource for the distinct test, the second positioner of the handler manipulates the second DUT from the second unit to the second socket for the distinct test. The distinct test is performed on the first DUT in the first socket, as the second DUT is dispositied from the second unit and posited in the first socket by the handle and on the second DUT in the second socket, as the first DUT is dispositied from the first unit and posited in the second socket by the handler. The handler controls the relay to respectively connect to the first socket after the distinct test is performed on the second DUT in the second socket and to the second socket after the distinct test is performed on the first DUT in the first socket. Each next successive DUT of remaining staged DUTs awaiting test, is respectively handled/manipulated via respective components of the tandem handler configuration, and tested respectively and in succession by the test resource of the same tester via the separate sockets, until all DUTs have been tested or testing is otherwise concluded or interrupted.

Another embodiment of the invention is a method of testing. The method of testing includes first manipulating a to-be-tested device (TBTD) of a plurality of TBTDs, via a first robot, into connection with a first pin stimulatable by a test resource of a tester, first controlling the tester to connect the test resource to the first pin and commence a test by the tester resource at the first pin on the TBTD connected to the first pin, second manipulating another TBTD of the plurality, via a second robot, into connection with a second pin stimulatable by the test resource of the tester, second controlling the tester to connect the test resource to the second pin and commence the test by the tester resource at the second pin on the TBTD connected to the second pin, and master controlling to perform at least part of the step of first manipulating as to each next TBTD of the plurality during test by the tester resource at the second pin, to perform the step of second controlling upon completion of test by the tester resource at the first pin, to perform at least part of the step of second manipulating as to each next TBTD of the plurality during test by the tester resource at the first pin, and to perform the step of second controlling upon completion of test by the tester resource at the second pin. A tandem handler associated with the tester, and dual parallel connected sockets to the tester and its test resources, allow for steps of respective and segregated mechanical pre-test prepping/staging/positioning and post-test prepping/staging/positioning, as optimal and desired. The steps of the method repeat as to successive devices tested, along somewhat separate test progression paths/operations of the handler and its tandem (i.e., dual) features thereof; but the single tester is employed to test at each of the dual sockets in succession (i.e., each tester resource is substantially immediately switched in connection from a respective functionally equivalent pin of one socket after completion of testing there, to the respective functionally equivalent pin of the other socket for testing there, and vice versa, repeated until testing on all to-be-tested devices is completed or halt or interruption of testing occurs).

BRIEF DESCRIPTION OF THE DRAWINGS

The present invention is illustrated by way of example and not limitation in the accompanying figures, in which like references indicate similar elements, and in which.

DETAILED DESCRIPTION

Figure 2:
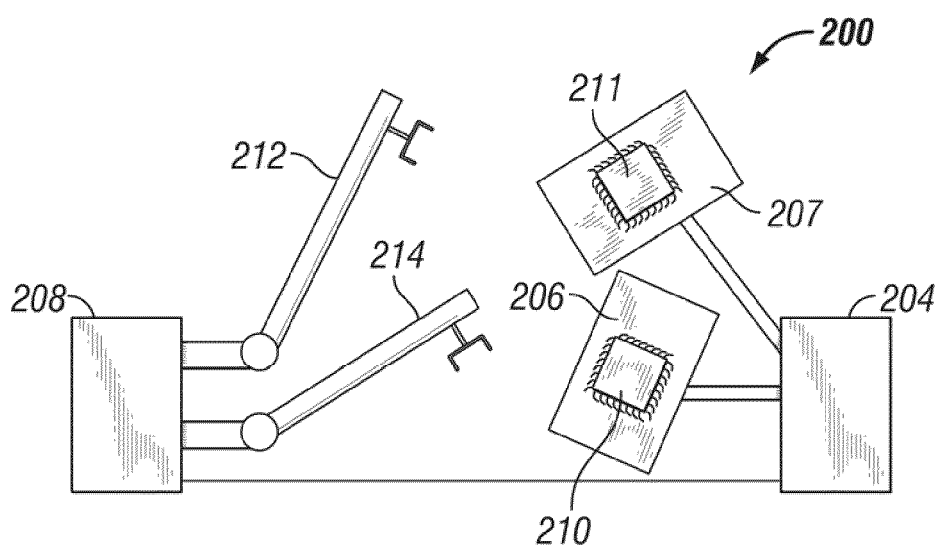
FIG. 2 illustrates a system for testing including a tester, an interface board that interconnects the tester and its test resources to the test device(s) under test, two test sockets connected in parallel to the same set of tester resources and mounted to the interface board, and an automated handler with dual manipulator arms, according to certain embodiments of the invention.

Referring to FIG. 2, a system 200 for testing a device (i.e., also referred to herein and in the claims as a "device under test" and/or a "DUT", and meaning one or more such devices as previously discussed in the background) includes a tester 204, an interface board 206 communicatively connected to the tester 204 for interconnecting the tester resources to the device under test, and a robotic handler 208. The robotic handler 208 is communicatively connected to the tester 204. The interface board 206 is communicatively connected to the tester and two or more test sockets 210 and 212 (i.e., as previously discussed in the background, the term "socket" herein and in the claims means one or more sockets; and when referred to in the singular, socket means one or more connected in parallel to the tester for non-concurrent testing by a same test resource, or otherwise refers to more than one socket of the limited and rare situation of the special case tester configuration discussed in the background). The test sockets 210 and 221 are wired in parallel, via the interface board 206 connection with the tester 204, to the tester 204 and to the tester resources of the tester 204. Because of the parallel connectivity of the test sockets 210 and 212, each socket 210, 212 is separately interfaced to the tester 204 and to the same test resources of the tester 204; however, the tester 204 can test only one or the other of the sockets 210, 212 via the same tester resources, at any instant.

Figure 1:
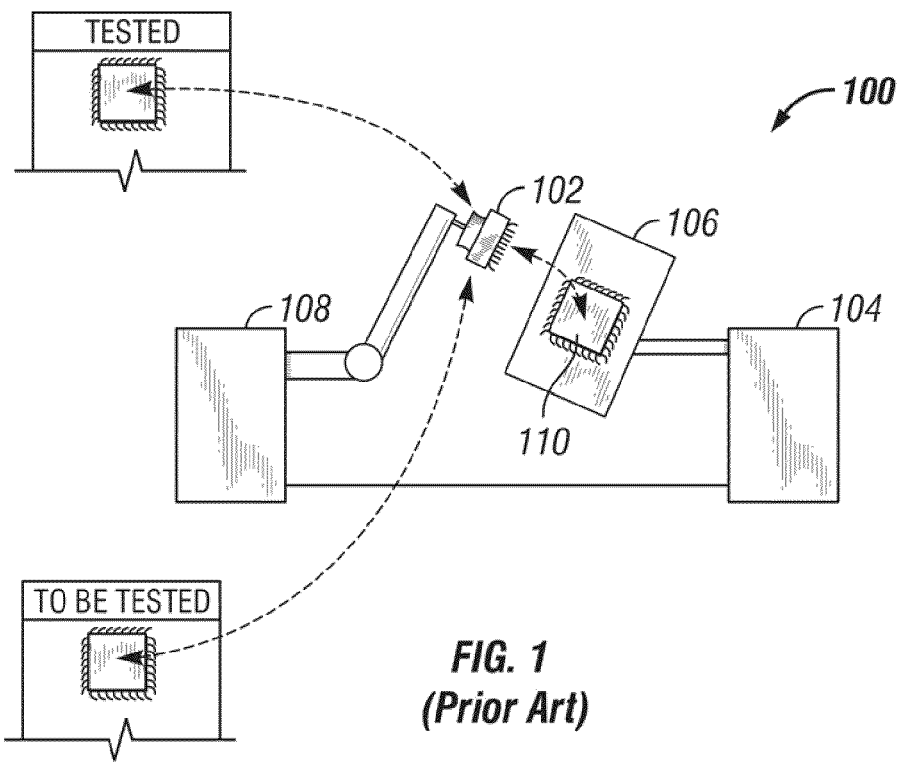
FIG. 1 illustrates a prior system for testing including a tester, an interface board that interconnects the tester resources to the device under test, one test socket on the interface board, and an automated handler with a single manipulator arm.

In the system 200, the handler 208 and the tester 204 communicate substantially as described in reference to FIG. 1 and system 100 with regards to the handler 108 and the tester 104, in that the handler 208 issues a start-of-test signal to commence testing by the tester 204 and then the tester 204 returns to the handler 208 various result data and an end-of-test signal on test completion so that the handler 208 then commences next test device mechanical placement operations. Even in a multi-site configuration (where multiple sockets are wired to different distinct test resources of a tester that permits concurrent testing via separate test resources), the same information required to identify missing devices in such a multi-site configuration are similarly communicated to the tester 204 by the handler 208. Because these communications are substantially conventional (whether the tester does or does not provide for concurrent testing via different test resources), the tester 204 in the system 200 can be any conventional tester having sequential testing capabilities for respective devices or sets of devices, such that next testing of the same tester resources can promptly commence via the tester upon completion of a preceding test of those tester resources.

The robotic handler 208 includes a first manipulator 212 and a second manipulator 214, each connected to and controlled in a coordinated and autonomous fashion by the robotic handler 208. Each of the first manipulator 212 and the second manipulator 214 is capable of handling a separate test device (or devices, if the manipulators 212, 214 have capabilities of handling more than one test device in each mechanical manipulation). When the first manipulator 212 has picked-up and positioned a first device to be tested in the socket 210 of the interface board 206, the other second manipulator 214 is concurrently retrieving a next second device to be tested. During testing of the first device in the socket 210, the second manipulator picks-up and stages the second device to be tested at socket 211.

The term "staging", used above, means that the second device handled by the manipulator 214 is not inserted into the socket 211, but is positioned mechanically close to insertion at the socket 211 without making electrical contact with the socket 211. Then, when the handler 208 receives an end-of-test signal from the tester 204, the manipulator arm 212 removes the first device from socket 210, while manipulator arm 214 simultaneously inserts the second device into the socket 211. As soon as manipulator arm 214 has fully inserted the second device into socket 211 and full electrical contact has been made between the second device and the socket 211, the handler 208 issues a next start-of-test signal to the tester 204 and testing begins on the device inserted into socket 211.

From the perspective of what is communicated to, controlled by, and tested at the tester 204, there is no difference between socket 210 and socket 211 since they are both connected to the tester 204 and its same set of tester resources. However, the tester 204 conducts testing via any particular tester resources only as to one of the sockets 210, 211 at each instant. Negligible index time results at the tester 204 in any lag period between each end-of-test signal that the tester 204 issues to the handler 208 and each next start-of-test signal issued by the handler 204 to the tester 208. Because of the parallel interfacing of the sockets 210, 211 via the interface board 206 to the tester 208, only one of the sockets 210, 211 wired to each same set of tester resources has a device inserted at any instant of time. Hereinafter, the operation of staging of each next device to be tested close to insertion in a socket, but without making electrical connection to the socket, is referred to as "pre-positioning"; and the phrase "manipulator locating a device" includes either full insertion for electrical contact or pre-positioning of a device relative to a socket.

In the system 200, when testing begins on the second device in socket 211, the first manipulator 212, as a requirement for the system 200 (and as is the arrangement with operations of any conventional tester), has already removed the first device from the socket 210, and proceeds without delay to disposition the first device just tested and then retrieve and pre-position a next untested device for testing. The mechanical motions of the manipulator 212 in retracting the already tested first device, to the pre-positioning of the next untested device, occur during the time period that the second device in the socket 211 is being tested. These mechanical motions of the manipulator (either manipulator 212 or manipulator 214) during the time period that the other manipulator (manipulator 214 or 212, respectively) maintains a next device in a socket for active testing, is herein referred to as "manipulator indexing." Manipulator indexing on manipulator 212 occurs while manipulator 214 is engaged in testing the second device in the socket 211 and also while manipulator 214 is not mechanically indexing. Likewise, manipulator indexing on manipulator 214 occurs while manipulator 212 is engaged in testing the device in the socket 210 and also while manipulator 212 is not mechanically indexing. The respective manipulator mechanical operations, and relevant manipulator indexing, is repeated for so long as either there remains additional untested devices available and waiting for test, there are no error conditions that halt operation of the system 200, or a human operator has not intervened to interrupt the sequence.

Figure 3:
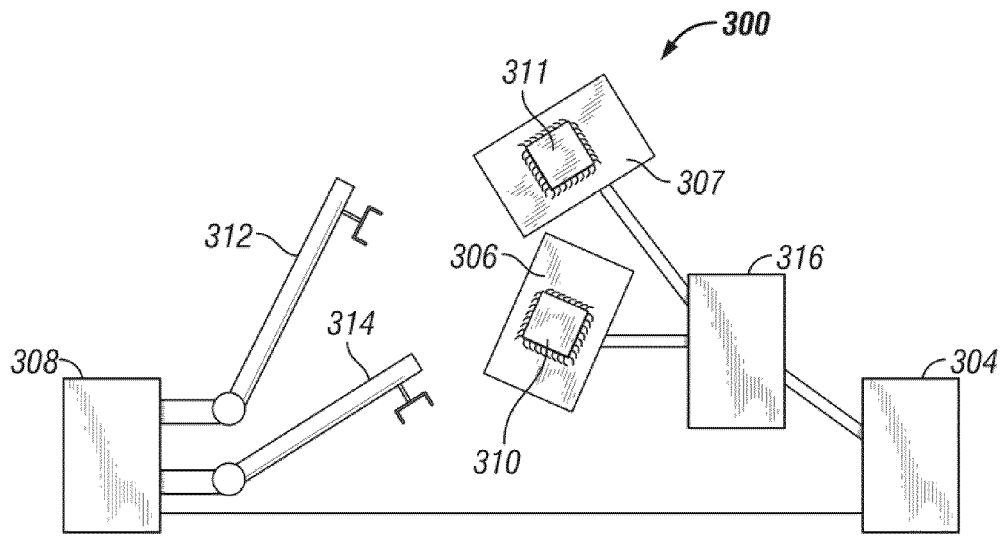
FIG. 3 illustrates a system for testing substantially like that of FIG. 2, also including a switch on the interface board that interconnects the tester and its resources to the test device(s) under test between the two test sockets on that interface board, for switching of test between those test sockets, according to certain embodiments of the invention.
Figure 4:
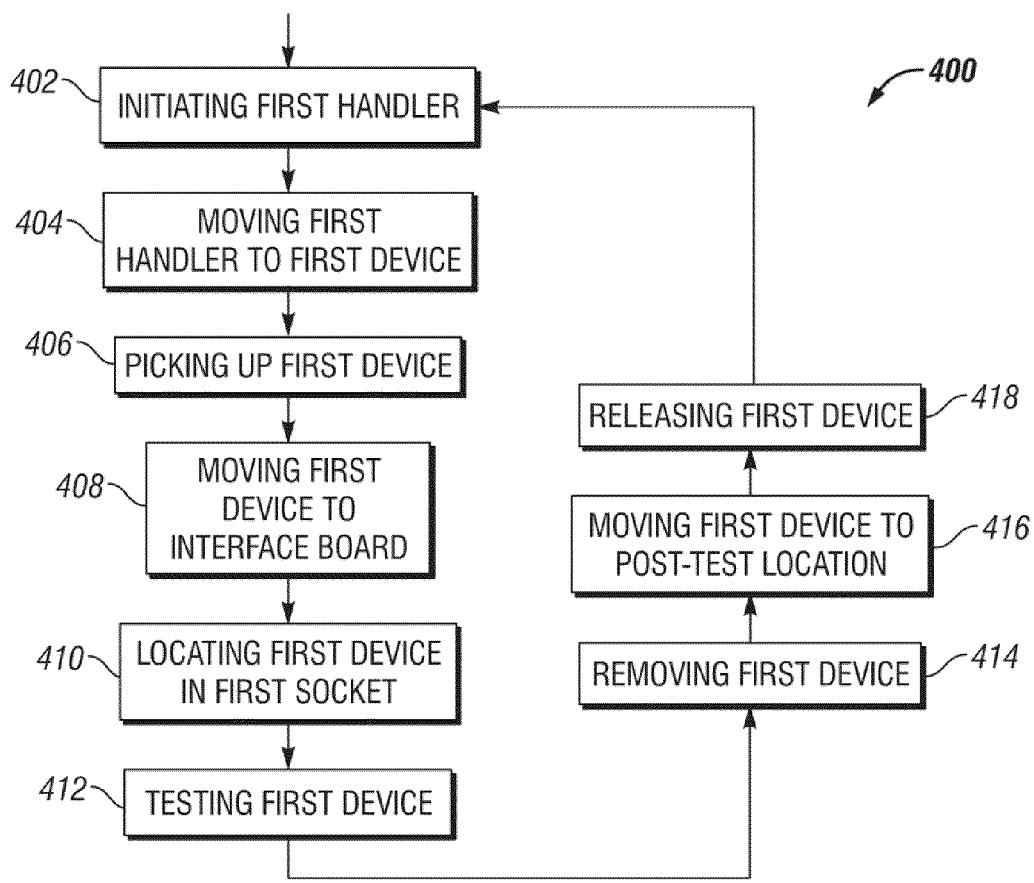
FIG. 4 illustrates a prior method for testing including index time required for a manipulator arm to move and replace each next successive test device for testing, such that testing of successive devices is interrupted and idle during periods of operation of the manipulator arm in moving and replacing each successive test device.

Referring to FIG. 3, a system 300 for testing a device 302 includes a tester 304, a robotic handler 308 having a first manipulator 312 and a second manipulator 311, an interface board 306 having a first socket 310 and a second socket 311, and a relay 316. The handler 308 is communicatively connected to the tester 304 and also communicatively connected to the relay 316 via the interface board 306. The interface board 306 is communicatively connected to the tester 304, the handler 308, the relay 316, and the sockets 310 and 311. The first socket 310 and the second socket 311 are communicatively connected to the tester 304 in parallel via the relay 316, such that the tester 304 is selectively switched in communicative connection, between testing at the socket 310 or the socket 311.

The relay 316 includes switch elements (not shown in detail) to switch testing connectivity between, respectively, the first socket 310 and the second socket 311. The relay 316 is not needed in low frequency testing (as shown in FIG. 2) because splitting of signals from the tester 304 to the first and second sockets 310, 311 will not result in asymmetries that cause significant timing and impedance problems. A rule of trace length matching in the design of the interface board 306 and interface board 206 (as shown in FIG. 2) should always be practiced since most semiconductor test systems use TDR (Time Domain Reflectometry) to calibrate out propagation delay among all signal connections between the tester and all interface pins on a device under test. Unequal trace length matching for a split signal, even when switched by relays as in system 300, will confuse a TDR system and result in erroneous calibration data and invalid test results. Additionally and to the extent possible, the transmission line impedance profile required by a given TDR system should be observed in the design of any test cell interface hardware.

Where higher frequency testing is conducted, however, splitting of signals from the tester 304 to the sockets 310, 311 can result in asymmetries such that timing and impedance problems can be significant. In such situations of higher frequency testing, therefore, the system 300 (of FIG. 3) switches the test signals between test socket 310, on the one hand, and the test socket 311, on the other hand, as applicable, to prevent impedance asymmetries of the test signals in respective testing at the sockets 310 and 311 at different time intervals. Observing a rule of trace length matching in the design of the interface board 306 allows TDR to be executed on system 300 as normal and without error.

In the system 300, the handler 308 and the tester 304 communicate substantially as described in reference to FIG. 1 and system 100 with regards to the handler 108 and the tester 104, in that the handler 308 issues a start-of-test signal to commence testing by the tester 304 and then the tester 304 returns to the handler 308 various results data and an end-of-test signal on test completion so that the handler 308 then commences next test device mechanical placement operations—i.e., the manipulator locating a next device for testing.

Further in the system 300, the communicative connection between the handler 308 and the relay 316, via the interface board 306, provides the handler 308 with conventional signals and communications with the tester 302 for appropriate handler 308 operations. The handler 308, itself, detects (or "knows") which of either socket 310 or socket 311 has therein located a next device waiting for test. The handler 308, therefore, can control the relay 316 switching to switch the tester 302 and tester resources between the first socket 310 or the second socket 311, according to the socket 310 or 311 holding the next device for test. An algorithm for relay 316 control is integrated into the same program of the handler 308 that controls the manipulators 311,312. Particularly, once an end-of-test signal issues from the tester 304 to the handler 308, the handler 308 sends a control signal to the relay 316 and switches it according to the next ready test device in the socket 310 or 311 as detected by the handler 308. The tester 304 operations effectively need not be altered, because the tester 304 merely continues testing of the next device and treats each socket 310, 311 individually as a single socket connected to the same set of tester resources for purposes of tester 304 operations.

The tester does not detect and has no indicator (i.e., is not "aware") that there are two different physical socket locations (sockets 310 and socket 311). The tester 308, therefore, does not and need not have the information required to control the switching of the relay 316. Because the handler 308 has information applicable to control of the switching of the relay 316, the handler 308 can serve to switch the relay 316.

Alternatively, though, if the tester 304 must control the relay 316 (as may be applicable in certain applications or in alternative embodiments herein), a test program executing on the tester 308 must query the handler 308, receive the switching data, process the data into information in order to make a decision about switching and test device location among the sockets, and then send a control signal to the relay. This alternative requires code modification, recompilation, code testing, correlation, and release. It is expected that such variation of tester 308 control of switching would additionally add cost to the handler 308 design, since the handler 308 would be required to have an updated command set in the handler 308 system software. This work is both expensive and time consuming, but can be implemented with cost as an alternative arrangement for control of switching of the relay 316 and successive respective testing of devices in multiple sockets.

In operation of the system 300, the first socket 310 communicatively connects to the tester 304 through the relay 316, for testing of a device placed in the first socket 310. Then, the relay 316 causes the first socket 310 to be communicatively disconnected from the tester 304, and the second socket 311 communicatively connects to the tester 304 through the relay 316. In this manner, a device in the first socket 310 is tested by the tester 308, immediately followed by testing of another device in the second socket 311. The first manipulator 312 manipulates the device for the first socket 310 into and out of the first socket 310 during times of testing the other device in the second socket 311, and vice versa. The system 300, thus, eliminates idle time of the tester 308 which is otherwise experienced when the first manipulator 312 and the second manipulator 311 are respectively mechanically operating to pick-up, position on the socket, and remove devices in testing operations.

Figure 5:
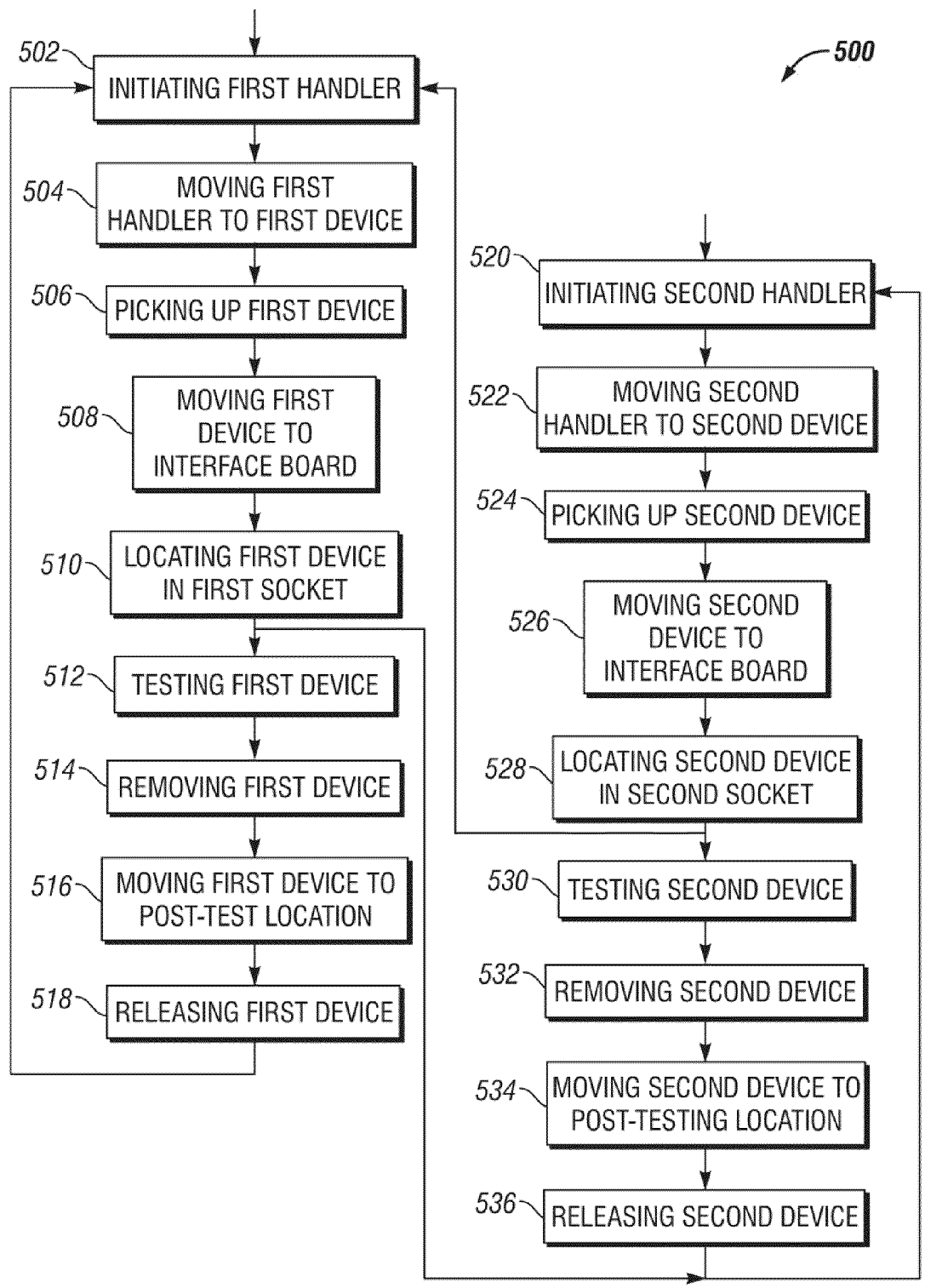
FIG. 5 illustrates a method for testing including negligible index time required, wherein a pair of test sockets and two manipulator arms effect immediate successive testing of devices at each of the test sockets on the interface board, the sockets are wired in parallel to the same set of tester resources on the interface board that interconnects the same set of tester resources to the devices under test, and the negligible index time is achieved by moving and replacing a device in one test socket while testing is being performed in the other test socket, and vice versa, according to certain embodiments of the invention.

Referring to FIG. 5, a method 500 operates in the system 200 of FIG. 2 or the system 300 of FIG. 3. In the method 500, a first manipulator is initiated in a step 502 to commence retrieval of a first test device for testing in a first socket of an interface board connected to a tester. The tester in the method 500 is also connected to a second socket, but in parallel communicative connectivity with the first socket. The method 500 can include relay of signals of the tester, such as occurs in the system 300 of FIG. 3 in a high frequency testing environment; or, alternatively, the signals of the tester can be split so that there is no relay of test socket testing signals. The same method 500 applies to operations of the manipulators for testing, notwithstanding whether or not any relay is present.

In a step 504, the first manipulator then moves to the first device for testing. The first manipulator picks-up the first device in the step 506. The first manipulator moves the first device to the first interface board in a step 508, and inserts the first device into the first socket of the first interface board in a step 510.

Thereafter, the tester commences testing the first device via the first socket, in a step 512.

Once the first device is located in the first interface board in the step 510 and as the step 512 of testing the first device commences, the second manipulator is initiated in a step 520. In a step 522, the second manipulator moves to a second device. The second manipulator picks-up the second device in a step 524, and moves the second device to the second interface board in a step 526. In a step 528, the second manipulator inserts the second device into the second socket of the interface board (either at the same time testing of the first device is occurring in the configuration of the system with the relay; or otherwise, immediately upon removal of the first device from the first socket after testing of the first device and insertion into the second socket of the second device is completed if there is not any relay).

Upon completion of testing the first device, the first manipulator in a step 514 removes the first device from the first socket in the first interface board. Promptly upon completion of testing the first device, the tester commences testing of the second device in a step 530. If the testing environment involves high frequency signals of the tester, the relay (of FIG. 3) switches the test signals of the tester from the first socket to the second socket, in order to begin the test of the second device. As previously mentioned, in low frequency testing, the relay is not necessary and test signals of the tester can be split between the first socket and device therein, and the second socket and device therein, without asymmetry concerns of timing and impedance problems. In either event, the testing of the first device concludes and the testing of the second device immediately commences. Thus, there is virtually no idle time of the tester and the index time in the method 500 is minimal.

During testing of the second device in the step 530, the first manipulator removes the first device from the first socket in the step 514. The first manipulator thereafter moves the first device in a step 516, such as to a post-test location for the devices being tested. In a step 518, the first manipulator releases the first device. Responsive to a signal indication from the handler that a next device is waiting to be picked-up by the first manipulator for testing in the step 512, the first manipulator is again initiated in the step 502. The method 500 then continues with respect to the first manipulator again through the steps of the method 500.

When testing of the second device is completed in the step 530, the method 500 as to the first manipulator has located a next successive test device in the first socket pursuant to the step 510 (either upon test completion and removal of the second device from the second socket and insertion of the next successive device in the first socket if no relay in the system; or otherwise, upon switching of tester resources to the first socket upon completion of the testing of the second socket where the system includes the relay). Thus, immediate testing of this next successive device commences via the step 512.

During the testing of the next successive device, the method 500 continues with respect to the second manipulator in the step 532 of removing the second device from the second interface board. Next, in a step 534, the second manipulator moves the second device to a post-test location. In a step 536, the second device is released by the second manipulator at the location.

The method 500 continues with respect to the second manipulator, during the testing at the first socket in the step 512, by again initiating the second manipulator in the step 520. As testing at the first interface board proceeds in the step 512, the second manipulator proceeds through steps 522, 524, 526 and 528 of the method 500. Once testing at the first interface board is completed, the second manipulator has, via the method 500, located a next successive test device in the second interface board and testing of the device proceeds in the step 530.

Of course, during the testing of the second device, the method 500 continues with respect to the first manipulator through the steps 514, 516, 518 and back to 502 of the method 500. In this manner, the tester is virtually continuously performing successive testing of respective devices in the successive steps 512, 530. While testing is proceeding in step 512, the second manipulator moves through the steps 532, 534, 536, and again to 520 and on, of the method 500. Likewise, while testing next proceeds in step 530, the first manipulator moves through the steps 514, 516, 518, and back to steps 502, 504, 506, 508 and 510 of the method 500. The method 500 proceeds continuously in this manner, until interrupted (for example, manually by a test supervisor, automatically because of default, or otherwise), or otherwise until all devices for testing are tested and handled in the method 500.

With the foregoing systems 200, 300 (of FIGS. 2 and 3) and method 500 (of FIG. 5), various alternatives and additions are possible. Particularly, certain conventional interface boards may have several test sockets or cells for simultaneous testing of multiple devices via a tester. In such instances, the robotic handler can have manipulators that simultaneously manipulate, move and place multiple testing devices in the interface board in a single pass. The systems 200, 300 will similarly include dual interface boards in parallel connection with the tester (or, if applicable, sets of parallel-connected sockets and/or interface boards), however, each interface board will have several sockets for simultaneous placement and testing of devices on each respective board. The method 500 will, nonetheless, proceed similarly, with the exception that multiple devices will simultaneously be handled by the respective manipulators.

In other alternatives, multiple manipulators beyond two, and multiple interface boards beyond two, can be employed. In such instances, each interface board can, likewise, have multiple testing sockets for simultaneous testing at each board of multiple devices. The interface boards can be communicatively connected in parallel to the tester, and any necessary relay can serve to switch test signals as required.

Moreover, testing systems in accordance with the systems 200, 300, and test steps and processes in accordance with the method 500, can be employed in a wide variety of manufacturing and testing operations. For example, semiconductor devices are only one type of devices suitably tested with the systems and methods. Other devices can include optical devices, with appropriate optical testing boards, relay, and tester; mechanical devices, with appropriate mechanical and physical test cells and tester; and any of a wide variety of other possibilities. In each such possibility, parallel connected interfaces to the tester, coupled with multi-manipulator operations, can reduce and eliminate index times in the test process.

In view of the foregoing, and without limiting the scope of the description herein, a detail of an example semiconductor test arrangement is given.

1. Semiconductor Automated Test Equipment (ATE)

Example Embodiment

Figure 6:
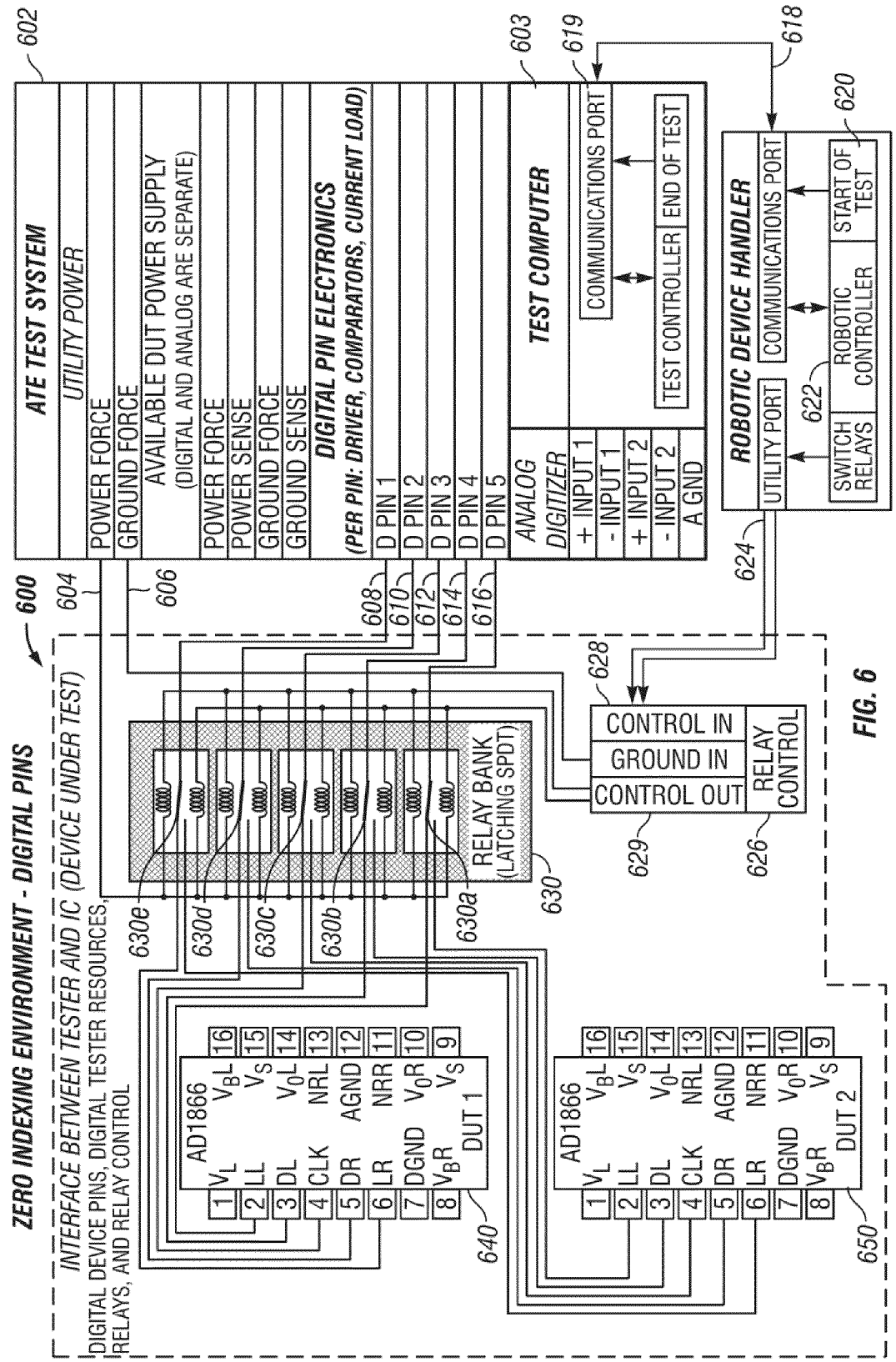
FIG. 6 illustrates a system for testing digital pins of devices according to the method of FIG. 5, wherein index time is negligible, including a switch on the interface board that selects between each of a pair of test sockets wired in parallel to the same set of tester resources, and two manipulator arms for manipulating devices for testing in one test socket while testing is performed in the other test socket, and vice versa, according to certain embodiments of the invention.

Referring to FIG. 6, a digital device testing system 600 can be used for testing a semiconductor chip or the like. The system 600 includes a conventional automated test equipment (ATE) 602. The ATE 602 is driven by a power supply (not shown) and includes a test computer 603 for controlling and performing applicable tests via the ATE 602. The ATE 602 has connector ports for power 604, ground 606, and digital pin electronics 608, 610, 612, 614, 616. The ATE 602 is communicatively connected, via a connector 618 at a communications port 619 of the ATE 602, to a robotic device manipulator 630 having dual manipulator arms. The robotic device handler 620 includes a robotic controller 622 for receiving and processing signals and test information from the ATE 602, via the connector 618.

A utility port 624 of the device handler 620 connects to a relay control 626 at a control port 628 thereof. The relay control 626 also connects to the ground 606 port of the ATE 602. Output control signals are connected to a relay bank 630, from a port 629 of the relay control 626.

The relay bank 630 includes a series of relay switches 630*a* through 630*e*, for example. Details of the relay bank 630 and relay control 626 are more particularly later described in connection with FIG. 7 herein. For purposes of discussion in connection with FIG. 6, each relay switch 630*a* though 630*e* is connected to respective and corresponding digital pins of a first device under test (DUT1) 640 and a second device under test (DUT2) 650. In FIG. 6, the switches 630*a* through 630*e* are set to communicate test signals to the DUT1 640. As previously described with respect to the method 500 in FIG. 5, both the DUT1 640 and the DUT2 650 are connected via respective interface boards (not shown in FIG. 6) to the relay bank 630. In this manner, after testing of the DUT1 640 is completed, the relay control 626 effects switching of the switches 630*a* through 630*e* of the relay bank 630, in order to next test the DUT2 650.

The relay control 626 selects switching of the switches 630*a* through 630*e* of the relay bank 630, based on control signal from the robotic device manipulator 624. The robotic device manipulator 624 communicates with (by exchange of signals back and forth) the test computer 603 of the ATE 602, for example, when testing of a device is completed. In the example, the robotic device manipulator 624 initiates the test process of the ATE 602 upon completing placement of the DUT1 640 in the interface board connected through the relay bank 630 to the ATE 602. The ATE 602 then conducts testing, according to the testing protocols programmed and controlled by the test computer 603 of the ATE 602.

Upon completion of the testing of the DUT1 640 by the ATE 602, the ATE 602 signals the robotic device handler 620 of the test completion, for example, by communicating test results for the DUT1 640 to the handler 620. The handler 620 then controls the manipulator arms as appropriate to remove the DUT1 640 from its socket on the interface board connected through to the ATE 602. Upon receiving the end of test signal from the ATE 602, the handler 620 signals to the relay control 626 and the relay control 626 flips the switches 630*a* through 630*e* of the relay bank 630 to communicatively connect the DUT2 650 through the relay bank 630 to the ATE 602. The handler 620 then issues the next start-of-test signal to the ATE 602, and the ATE 602 then commences testing of the DUT2 650.

As described in connection with the method 500 in FIG. 5, the robotic device handler 620 manipulates one of its manipulator arms to remove and move the already tested device and to retrieve and place a new device for testing, each time a device is tested. This operation of the device handler 620, coordinated with the relay bank 630 and ATE 602, ensures that the ATE 602 is substantially continuously testing a device while the other device is being removed and replaced.

Figure 7:
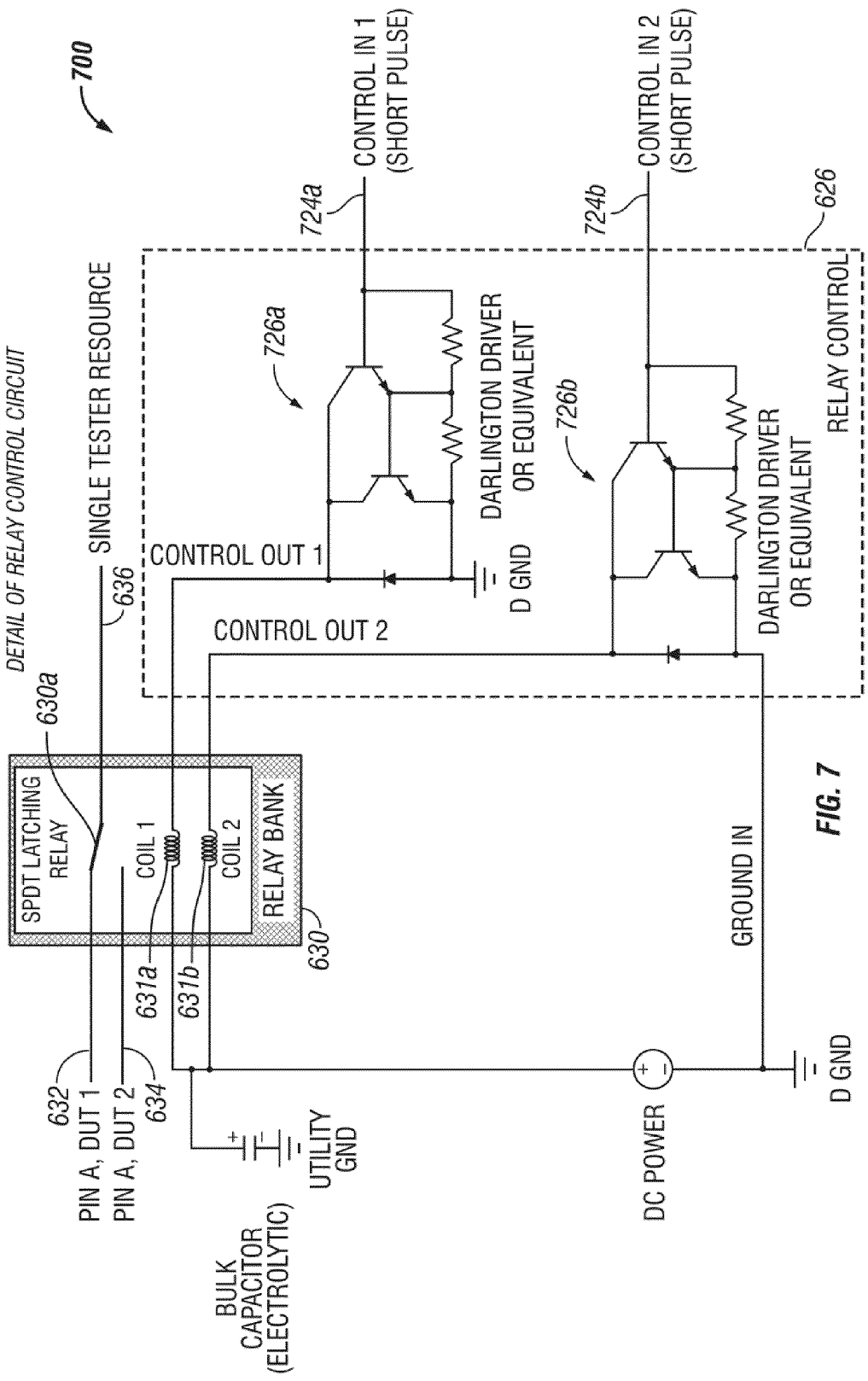
FIG. 7 illustrates an electrical circuit and hardware components for use in the system of FIG. 6, for controlling the switching of electrical connections between each test socket of a pair of test sockets on an interface board, wherein the switch selects between one of the pair of test sockets wired in parallel to the same set of tester resources and constrains the operation so that only one socket of the pair is connected to the tester at any given instant in time, and the switch provides electrical isolation from the tester for one of the test sockets, while the other socket is electrically connected to the tester and available for use in testing, and vice versa, according to certain embodiments of the invention.

Referring to FIG. 7, a relay 700, like that described in connection with FIG. 6, includes a relay control 626 and a relay bank 630. For purposes of the illustration in FIG. 7 and description of the relay 700, the relay control 626 and the relay bank 630 each provide for only a single switch 630*a*. The switch 630*a* operates between two possible connections, a connector 632 to Pin A, DUT1, or a connector 634 to Pin A, DUT2. The switch 630*a* effects communicative connection of either such connector 632, 634 to a single test signal 636 from the tester (not shown in FIG. 7). As is typical in the relay 700, relevant signals input as 724*a*, 724*b* from the robotic device manipulator (not shown in FIG. 7) cause the switch 630*a* to connect through the signal 636 through the switch 630*a* to either the connector 632 or 634, as desired for testing of the respective DUT1 or DUT2.

The relay control 626 has inputs of a first control signal 724*a* and a second control signal 724*b*, from the utility port 624 (not shown in FIG. 7) of the robotic device handler 620 of FIG. 6. Each control signal 724*a*, 724*b* connects to respective "Darlington Drivers" or equivalent power transistor drivers 726*a*, 726*b*. These drivers 726*a*, 726*b* are available, for example, from NTE Electronics, Inc. part number NTE215 Silicon NPN Transistor Darlington Driver. The respective drivers 726*a*, 726*b* connect to ground and also to a relay bank 730.

The relay bank 730 shown in FIG. 7 is substantially simplified from that used in the system 600 of FIG. 6, wherein multiple pins of each device under test (i.e., DUT1 and DUT2) are concurrently connected to the tester 602 through the relay bank 630. Nonetheless, the relay bank 630 of FIG. 7 illustrates a single switch 630*a* of the corresponding relay bank 630 in FIG. 6. The switch 630*a* is disposed at the relay bank 630 between coils 631*a*, 631*b*. The coils 631*a*, 631*b* are respectively driven by the outputs of the respective transistor drivers 726*a*, 726*b* of the relay control 626. The relay control 626, in this manner, switches the switch 630*a* in order to selectively communicatively connect either Pin A, DUT1 632 or Pin A, DUT2 634 for testing via the test signal 636 at each test instance.

In general in the embodiments, complete testing protocols will be performed on a first test device, then the relay control 626 will cause switching to a second device for testing, and thereafter repeated. During testing of any device, the next device for testing is being retrieved and located in the interface board for next testing. Then, upon completion of a test on a device, the relay control 626 switches the relay bank 630 to the next successive device for testing, and testing of each next successive device immediately commences and continues in this manner without any significant index time delays.

Figure 8:
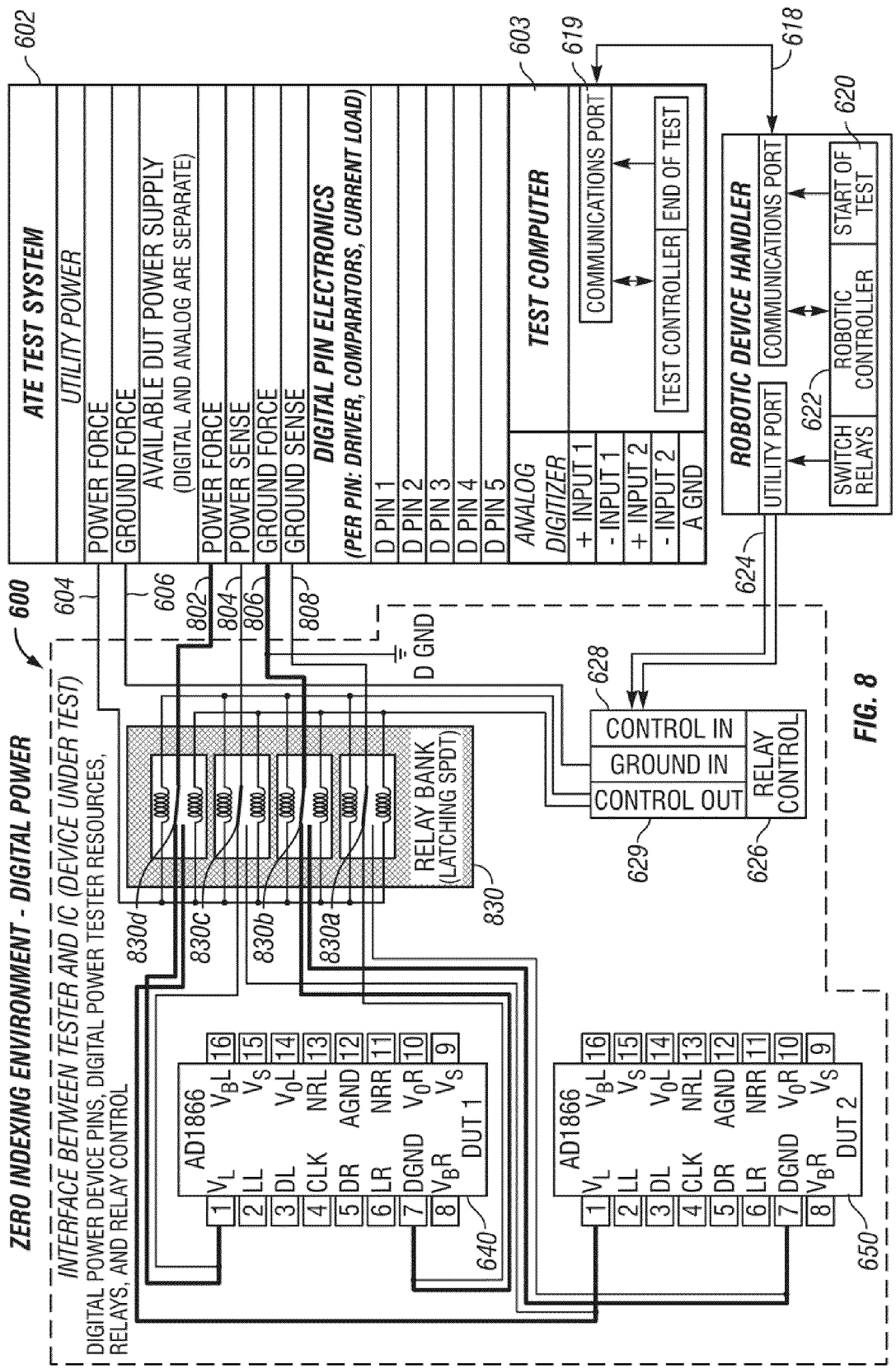
FIG. 8 illustrates a system, substantially like that of FIG. 6, for testing digital power of test devices according to the method of FIG. 5, according to certain embodiments of the invention.

Referring to FIG. 8, the system 600 of FIG. 6 is illustrated showing connections for digital power of devices in testing. Particularly, the system 600 includes the ATE 602, the robotic device handler 620, the relay control 626, and a relay bank 830 connected across switches 830*a* through 830*d* between power connectors 802, 804 and ground connectors 806, 808 and respective digital power pins of each of the DUT1 640 and the DUT2 650. As with the system 600 of FIG. 6, the system 600 in FIG. 7 serves to provide substantially continuous sequential power testing of the DUT1 640, followed by the DUT2 650, with robotic manipulator handling and replacement of each respective DUT while the other DUT is communicatively connected by the switches 830*a* through 830*d* of the relay bank 830 to the tester 602 for testing.

Figure 9:
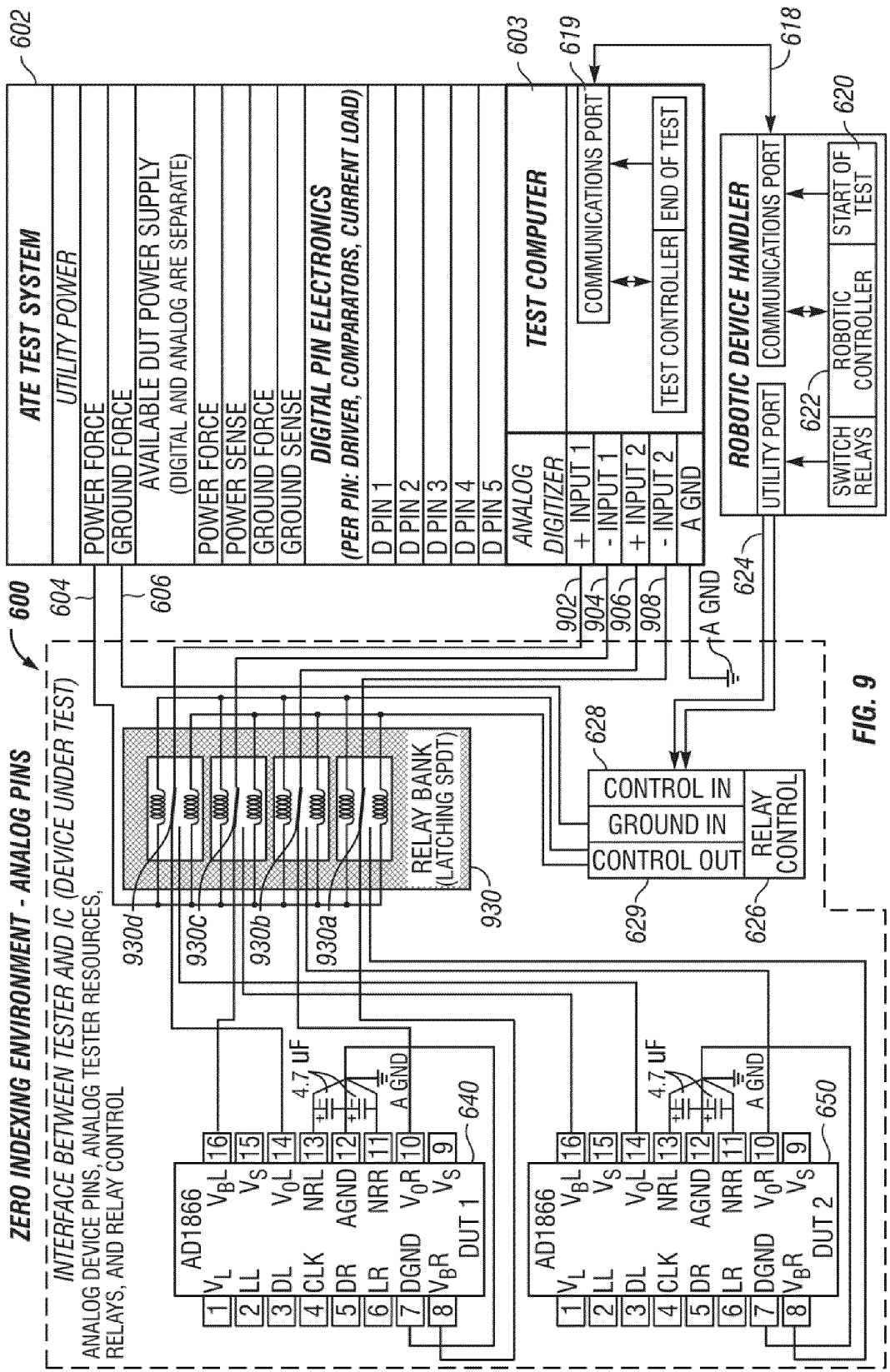
FIG. 9 illustrates a system, substantially like that of FIGS. 6 and 8, for testing analog pins of test devices according to the method of FIG. 5, according to certain embodiments of the invention.

Referring to FIG. 9, the system 600 of FIGS. 6 and 8 is illustrated showing connections for analog pin testing of respective devices, DUT1 640 and DUT2 650. In the system 600 of FIG. 9, the ATE 602 connects at analog digitizer connections 902, 904, 906, 908 to the respective switches 930*d*, 930*c*, 930*b*, 930*a* of the relay bank 930. Each of the switches 930*a*, 930*b*, 930*c*, 930*d* connects to the respective DUT1 640 and DUT2 650 at analog pins thereof. As with the system 600 of the prior illustrations, the switches 930*a*, 930*b*, 930*c*, 930*d* are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Figure 10:
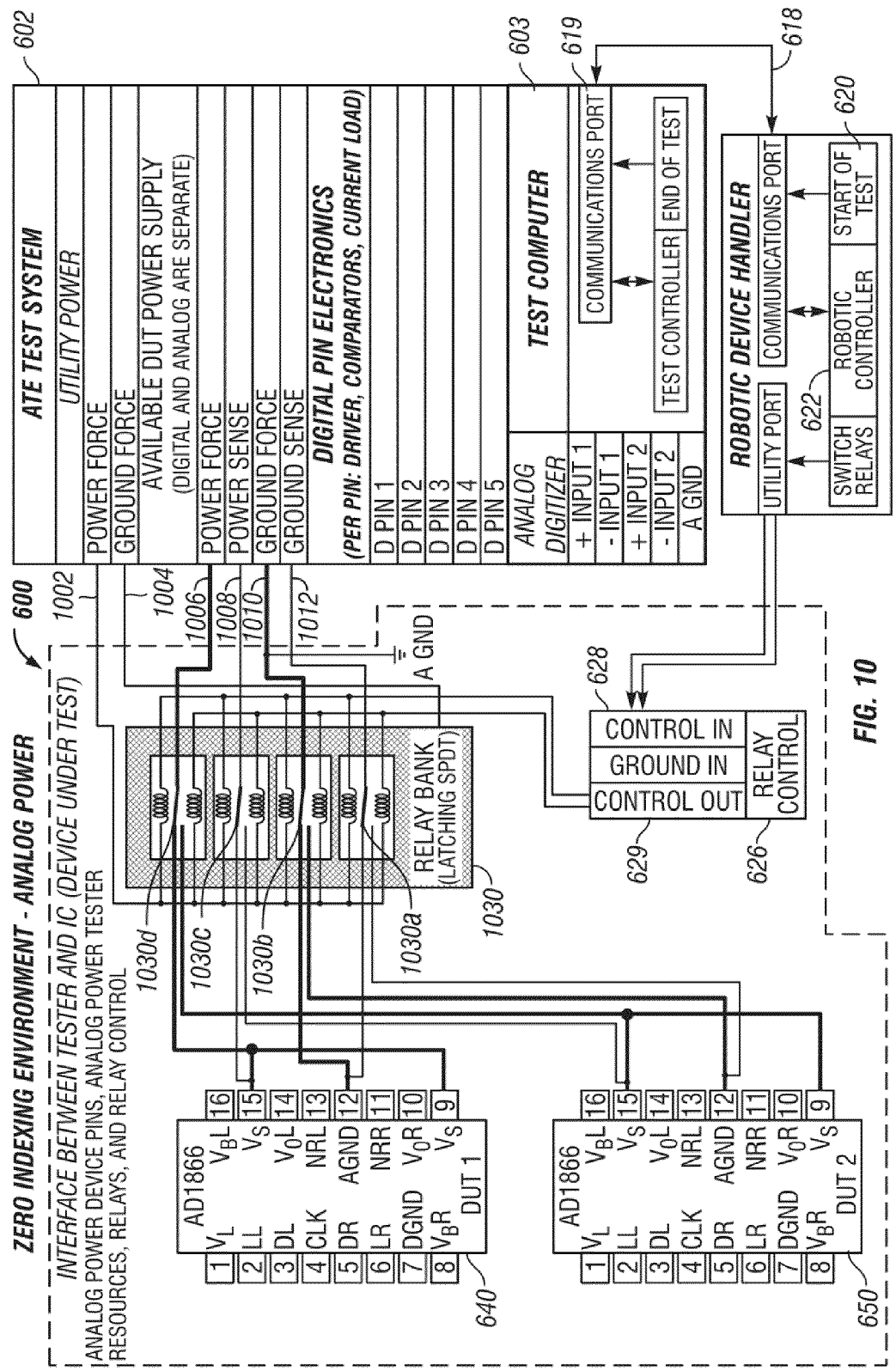
FIG. 10 illustrates a system, substantially like that of FIGS. 6, 8 and 9, for testing analog power of test devices according to the method of FIG. 5, according to certain embodiments of the invention.

Referring to FIG. 10, the system 600 of FIGS. 6, 8 and 9 is illustrated showing connections for analog power testing of respective devices, DUT1 640 and DUT2 650. In the system 600 of FIG. 10, the ATE 602 connects at utility power connections 1002, 1004 across the coils of the relay bank 1030 with the relay control 626. The switches 1030*d*, 1030*c*, 1030*b*, 1030*a* are connected to DUT power connections 1006, 1008, 1010, 1012 of the tester 602. Similarly to the prior discussion, the respective switches 1030*d*, 1030*c*, 1030*b*, 1030*a* of the relay bank 1030 each selectively communicatively connect the tester 602 to each of the respective DUT1 640 and DUT2 650 at analog power pins thereof. The switches 1030*a*, 1030*b*, 1030*c*, 1030*d* are controlled by the relay control 626, via the manipulator 630, in order to respectively communicatively connect the tester 602 for testing of each respective DUT1 640 and DUT2 650, in virtually uninterrupted succession. While one of the DUT's is being tested, the other DUT is being moved and replaced by the handler 620 with a next device for testing.

Referring to FIGS. 6 through 10, in conjunction, it is illustrated and can be understood that multiple ones of the relay banks 630, 830, 930, 1030 can be employed at the same time in the system 600, in order to perform testing of respective ones of the DUT1 640 and DUT2 650 in immediate succession. During testing of one of the DUT's, the handler 620 moves and replaces the other DUT. In such arrangement, the relay control 626 controls switching of each of the relay banks 630, 830, 930, 1030 in order that each DUT may be successively tested as the DUT1 640 and DUT2 650. Because the handler 620 changes a DUT with a new device for testing, during the testing of the other DUT, the index time for the system 600 is negligible and testing of successive devices is substantially continuous by the tester 602.

2. Optical Device Automated Test Equipment (ATE)

Example Embodiment

Figure 11:
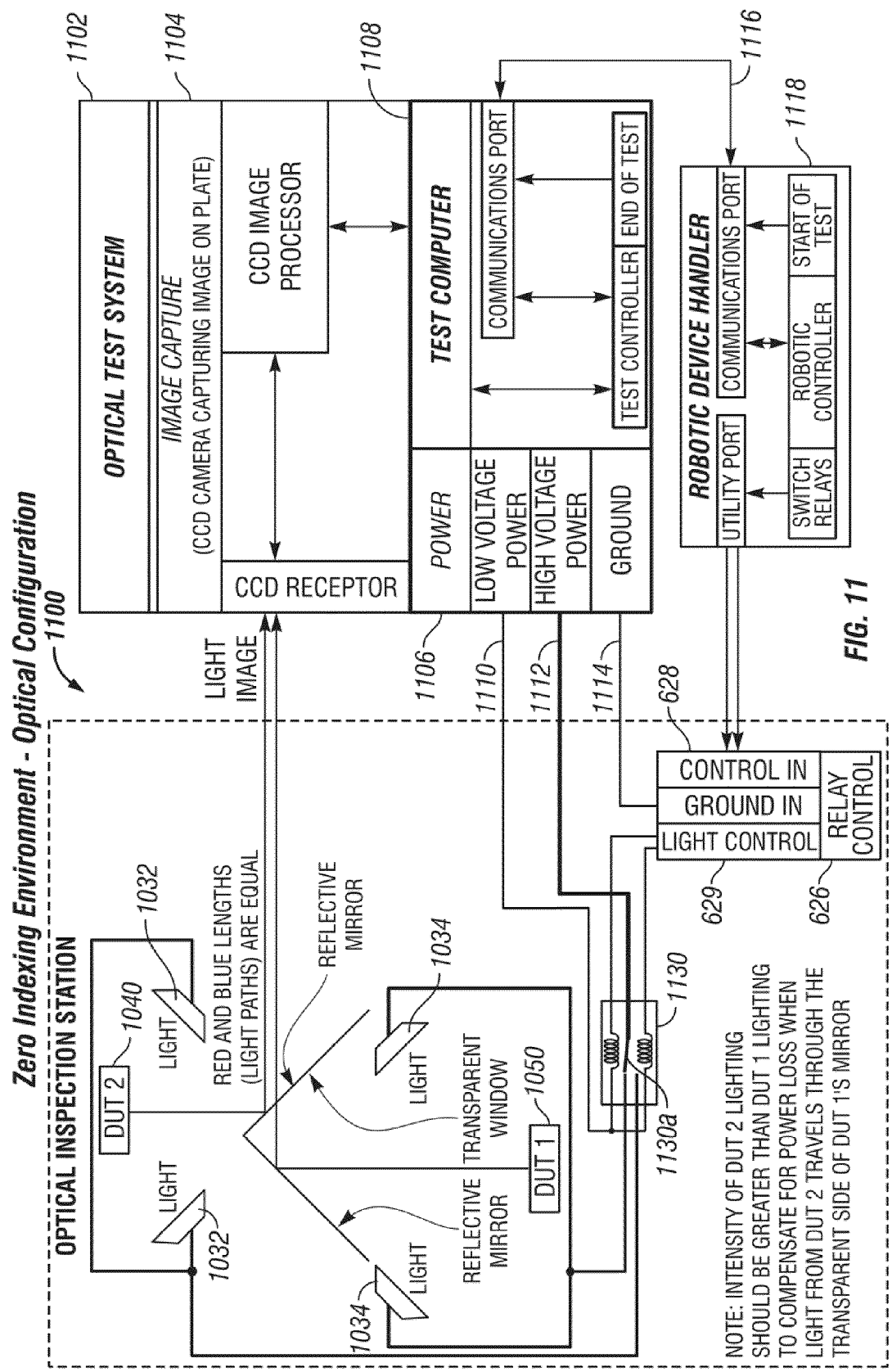
FIG. 11 illustrates a system for testing optical devices, substantially in accordance with the concepts of FIGS. 5, 6, 8, 9 and 10, according to certain embodiments of the invention.

Referring to FIG. 11, another test system 1100 for testing optical devices employs similar relay elements in order to perform continuous successive testing by a tester 1102. The tester 1102 includes an image capturer 1104, having a CCD receptor and a CCD image processor. The image capturer 1104 is connected to a test computer 1108 of the tester 1102. The tester 1102 also includes a power source 1106 and connections 1110, 1112, 1114 therefrom.

The test computer 1108 of the tester 1102 communicatively connects, via a connector 1116, to a robotic manipulator 1118. The robotic manipulator 1118 is substantially as has been previously described, including the manipulator 1118 has dual manipulator arms and receives test information and controls testing of respective dual devices, a DUT1 1050 and DUT2 1040, via connections to a relay control 626, as previously detailed. The relay control 626 controls switching of a switch 1130*a* of a relay 1130. The switching effects communicative connections, across the relay 1130, between the tester 1102 and respective test capture elements 1032, 1034 for the corresponding DUT1 1032 and DUT2 1034, respectively. As with the prior descriptions of the system 600 (of FIGS. 6, 8, 9 and 10), the system 1100 switches testing between the DUT1 1040 and the DUT2 1050, in immediate succession. During testing of one of the DUT's, the other DUT is moved and replaced by the manipulator 1118 with a next device for testing. In this manner, the tester 1102 substantially continues testing operations with each successive next device, with negligible idle index time.

Figure 12:
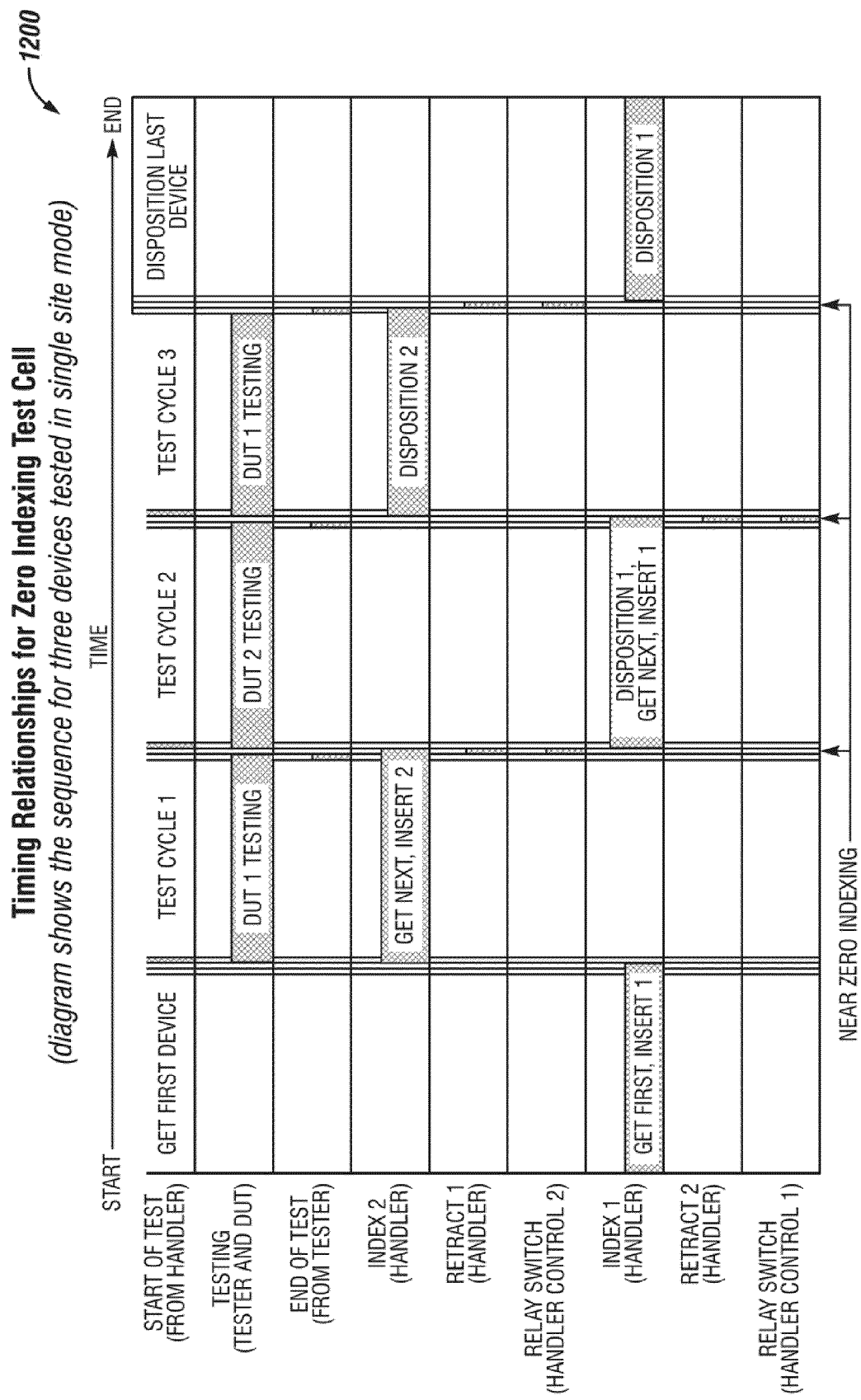
FIG. 12 illustrates timing relationships in test cycles of the method of FIG. 5 and the systems of FIGS. 6, 8, 9, 10 and 11, wherein negligible index time is required, according to certain embodiments of the invention.
Figure 13:
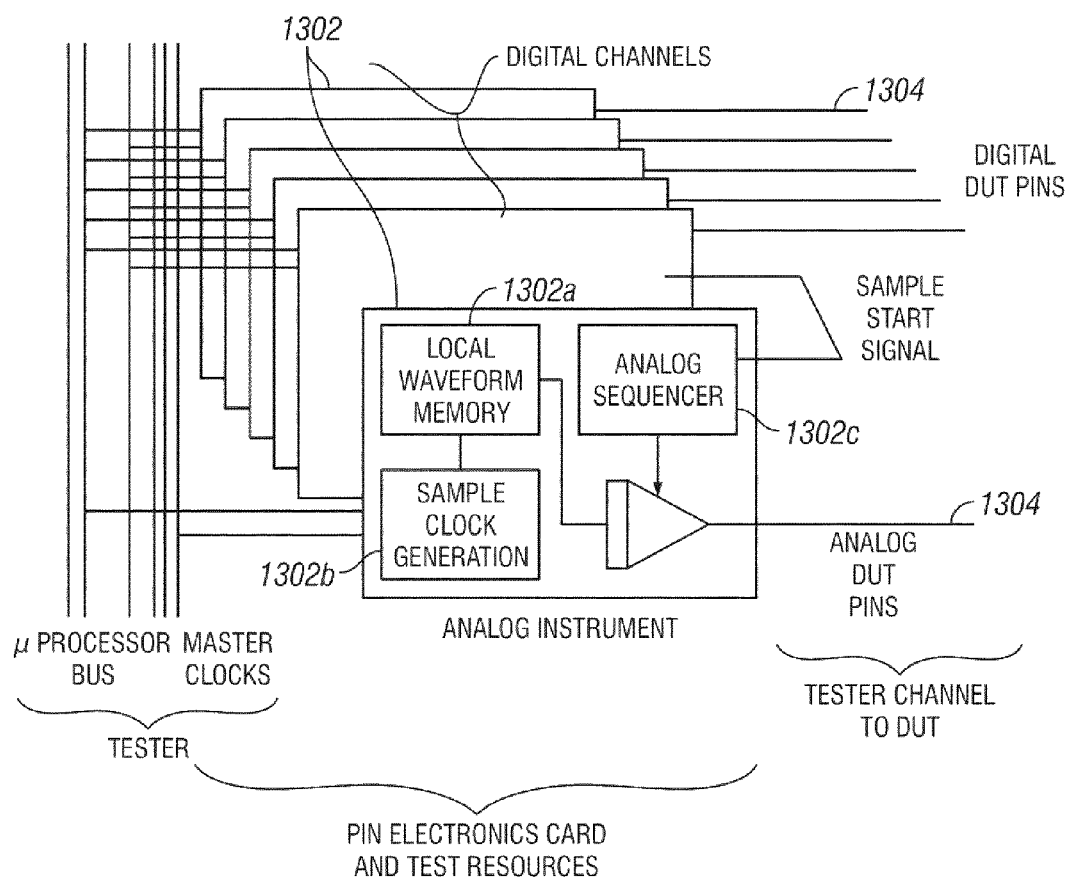
FIG. 13 illustrates a simplified functional example of a pin electronics card of a conventional tester, the pin electronics card including a set of test resources, and the test resources being connectable by a tester channel for the particular resources, to a single pin of a device under test, according to certain embodiments of the invention.
Figure 14:
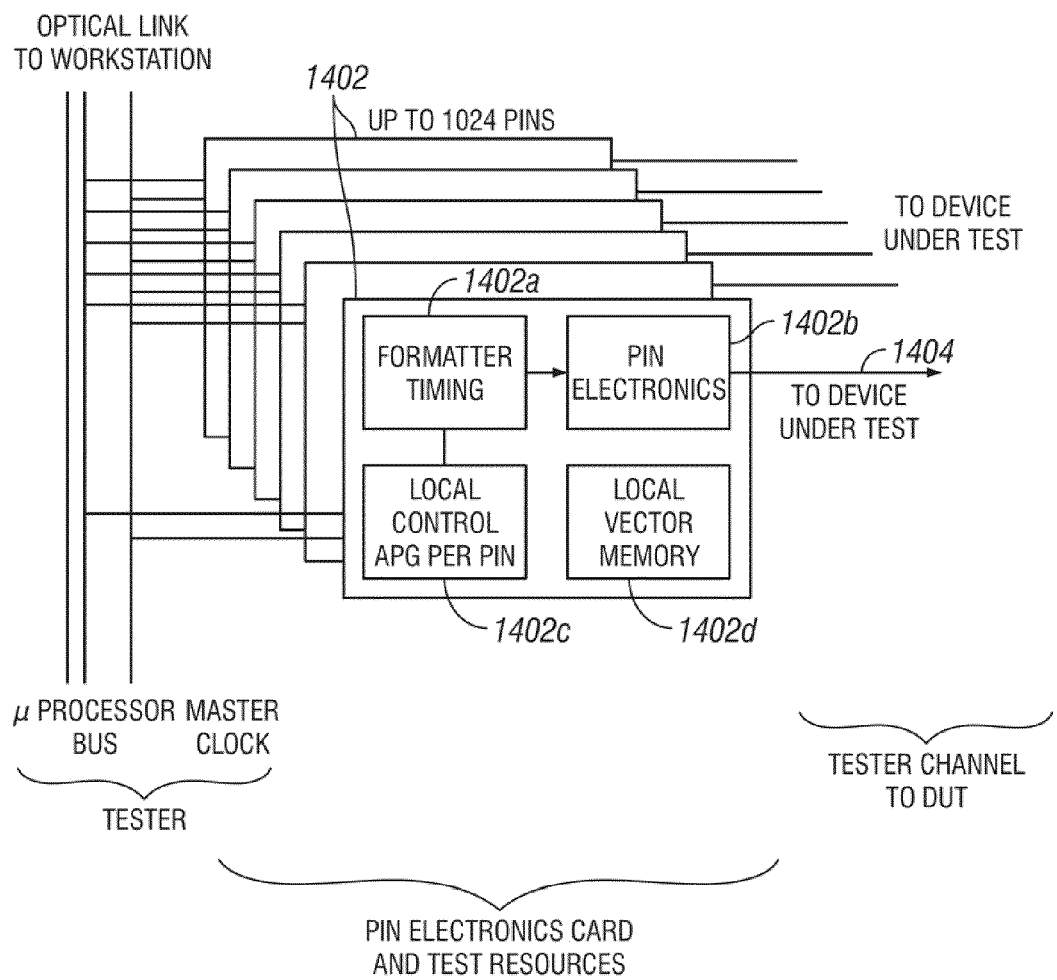
FIG. 14 illustrates another example of a pin electronics of a conventional tester, also including test resources, and the test resources being connected by a tester channel to a single pin of a device under test, according to certain embodiments of the invention.
Figure 15:
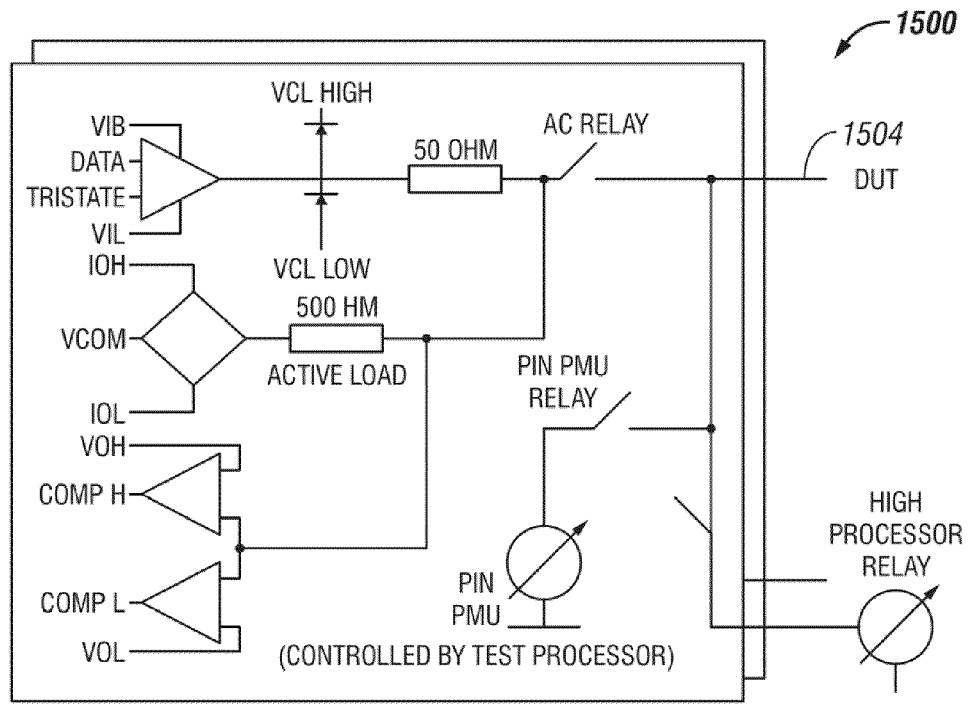
FIG. 15 illustrates a relay of a conventional pin electronics card of a typical tester, for electrically disconnecting/turning-off the test resources of the tester channel therefore, according to certain embodiments of the invention.

Referring to FIG. 12, a timing diagram 1200 illustrates testing cycles for respective first and second devices (i.e., DUT1 and DUT2) in a test system of the type described herein. It is notable in the timing diagram 1200 that index times are negligible, because the manipulator, via dual manipulator arms, can manipulate one device while the other device is being tested, and vice versa. Thus, at each instant, a device for testing is located in a socket for testing, and the system switches the test between devices in order to at each such instant continue testing for the device so readied for testing. Once testing of a device is completed, the other device can be immediately tested, upon switching of the test to the next device.

Pin Electronics Card Including Muxing Relay

Figure 16:
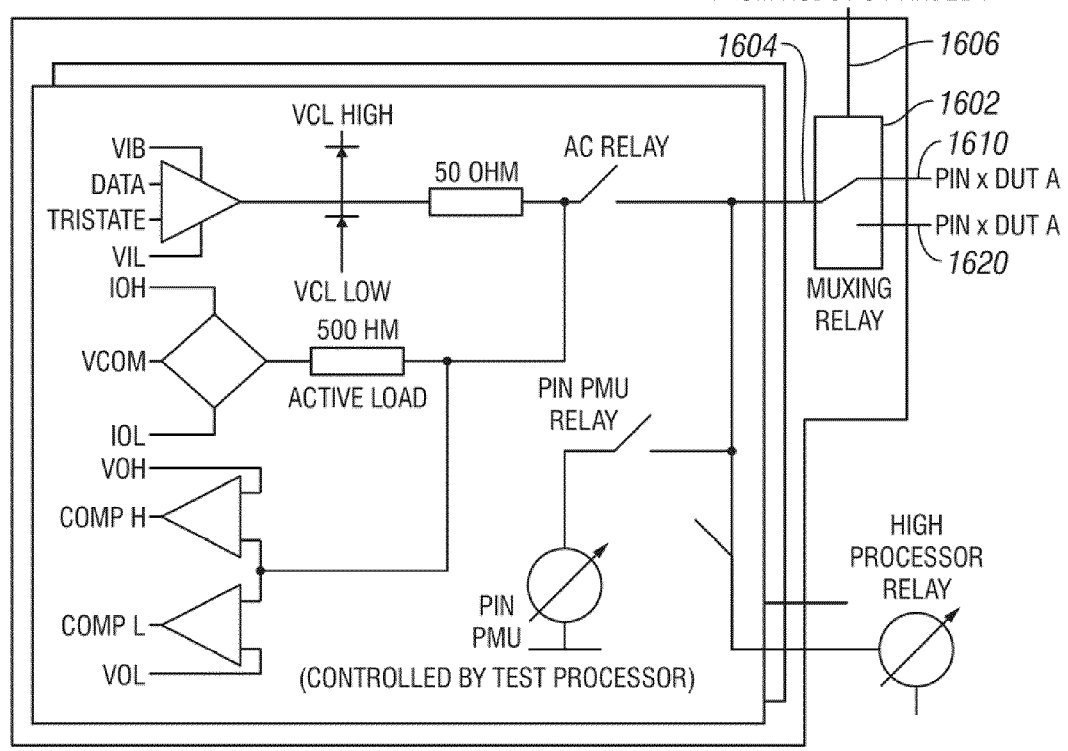
FIG. 16 illustrates a muxing relay of a pin electronics card of the present invention, the muxing relay being included in the pin electronics card and connected to a tester channel (i.e., a particular set of tester resources) of the card, providing dual leads for connection of the tester channel to equivalent pins of two separate devices (the "equivalent pins" being the same pin of the same type/model, etc. of two separate devices), the dual leads being trace length matched, according to certain embodiments of the invention.

Referring to FIG. 16, a pin electronics card 1600 of certain embodiments includes a muxing relay 1602. The muxing relay 1602 switches electronics of a tester channel 1604 of the card 1600 between two separate leads 1610 and 1620. The separate leads 1610 and 1620 are connected to an equivalent pin of two separate DUTs (i.e., DUTA and DUTB, not shown in detail).

The muxing relay 1602 is also connected to a switch control signal 1606. The switch control signal 1606 is connected to the handler (not shown, but previously described herein). The handler, as previously discussed, can provide control signals to the tester for testing of a DUT in place in a test socket of an interface board. Alternately, control signals can be from another source, manually directed by an operator, or otherwise.

In operation, the handler can handle two separate devices under test, DUTA and DUTB, to place and replace the devices in dual test sockets of the tester in the test site. The dual test sockets are operationally equivalent, at least with respect to the equivalent pin connection for devices under test and inserted into the sockets. For example, with DUTA in one of the sockets, the muxing relay 1602 is controlled by signal from the handler to switch electronic test resources of the tester channel to the socket containing DUTA. The tester channel is thereby electrically connected to a single pin of the DUTA, as applicable for testing by the tester.

During the testing of DUTA, the DUTB is located in the other of the sockets by the handler. Once testing of DUTA is completed, then the muxing relay 1602 is controlled by signal of the handler to switch electronic test resources of the tester channel to the socket containing DUTB. The tester channel thereby electrically connects to the equivalent single pin of the DUTB for testing that device.

During the testing of DUTB, a next device under test is retrieved by the handler and replaced in the socket that contained DUTA, and the process continues.

Of course, dual manipulators, as previously described, can serve to perform the ready placement in one socket while testing a device in the other socket.

Further referring to FIG. 16, the muxing relay 1602, although illustrated for example purposes as a last component from the pin electronics card 1600 providing the leads 1610, 1620 to DUTA and DUTB, can instead be configured/located in the pin electronics card 1600 at any appropriate connection. For example, so long as the muxing relay 1602 is effective to perform the muxing function as described, the muxing relay 1602 can alternately be connected within the other components/elements of the pin electronics card 1600. The particular configuration/location can optimize for minimal disturbance to signal integrity, for card manufacture or economics, or otherwise.

Moreover, the leads 1610, 1620 from the tester channel 1604 of the pin electronics card 1600 are preferably trace length matched. Trace length matching of the leads 1610, 1620, as will be known and understood by those skilled in the art, enables the same testing via the tester channel over the leads 1610, 1620, without any calibrations or corrections. For example, control of testing is provided by the handler. If traces are not matched in length, then the tester and/or handler must measure and implement different sets of calibration data for testing at the respective sockets. This would be complicated and likely would be costly in design and implementation. However, trace length matching of the leads 1610, 1620 is not necessarily required, and software or other elements of the tester and/or handler could provide for applicable and appropriate testing with the respective sockets, as desired, in other configurations.

The particular pin electronics of the tester channel 1604 can be digital or analog, or anything else. In any event, the tester channel 1604 is switchable among dual leads in order to electrically switch between equivalent pins of separate devices with negligible index time.

Particular design of the muxing relay 1600 depends on many factors in any particular configuration of tester, pin electronics card, testing, handler, and so forth. Design can account for different signals or signals where the signal and its differential counterpart or ground reference must be switch in a manner to maintain consistent impedance or maintain a minimum current loop, etc. In any such design, however, the base concept of connecting with one pin translated into two remains the same, and it makes no difference the particular electrical nature for the connection with the pin (e.g., doesn't matter if ground, digital signal, analog signal, differential signal or other). Those skilled in the art will understand and know various design possibilities, options, and approaches in any particular implementation, and all of these are intended as included here.

Figure 17:
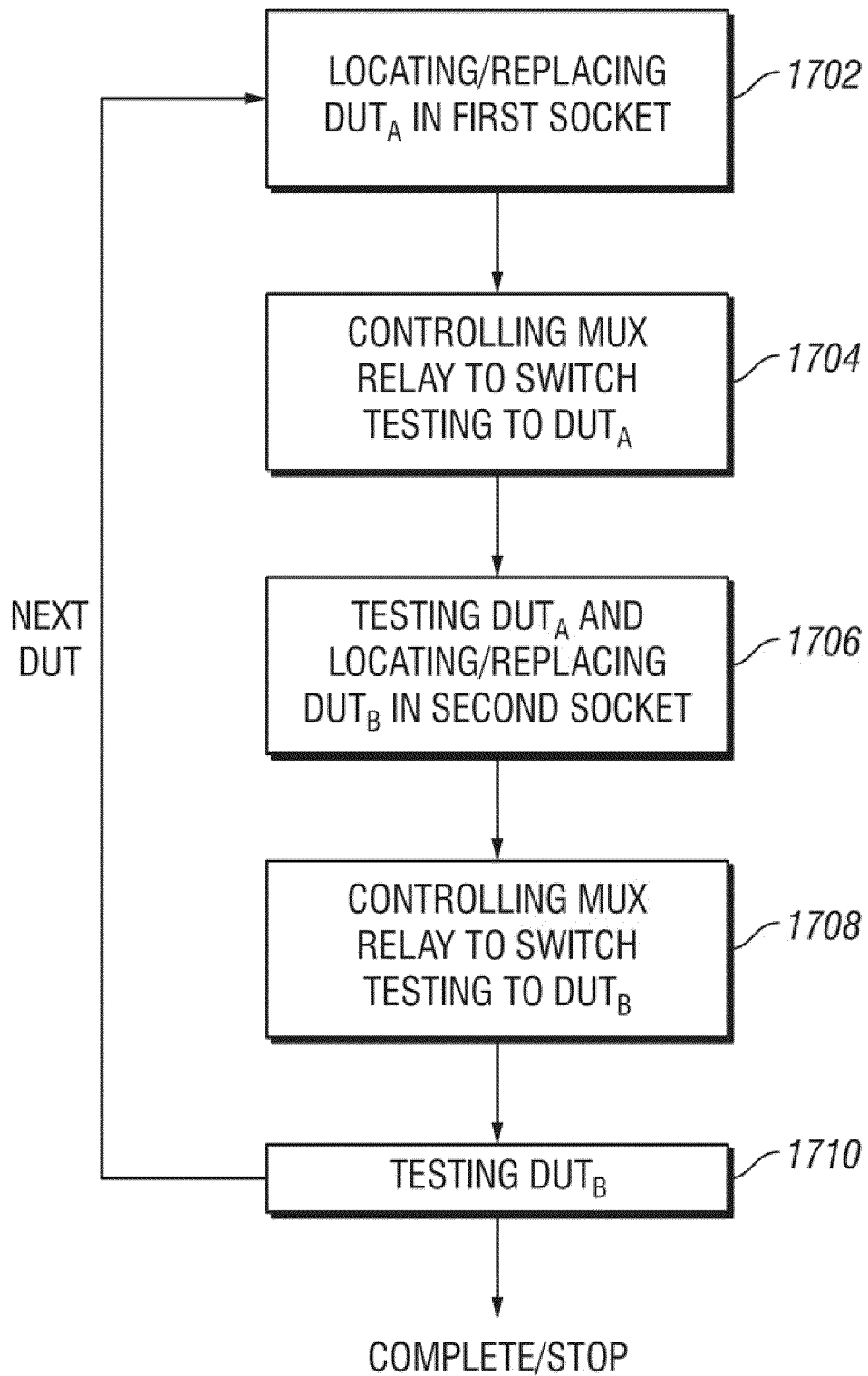
FIG. 17 illustrates a method for testing by the pin electronics card of FIG. 16 having the muxing relay and dual leads of the tester channel, those dual leads being connectable to an equivalent pin of two separate devices, wherein the muxing sequentially switches the tester channel to each next device, via switching electrically between the dual leads, with negligible index time between testing of one device and testing of the next device, according to certain embodiments of the invention.
Figure 18:
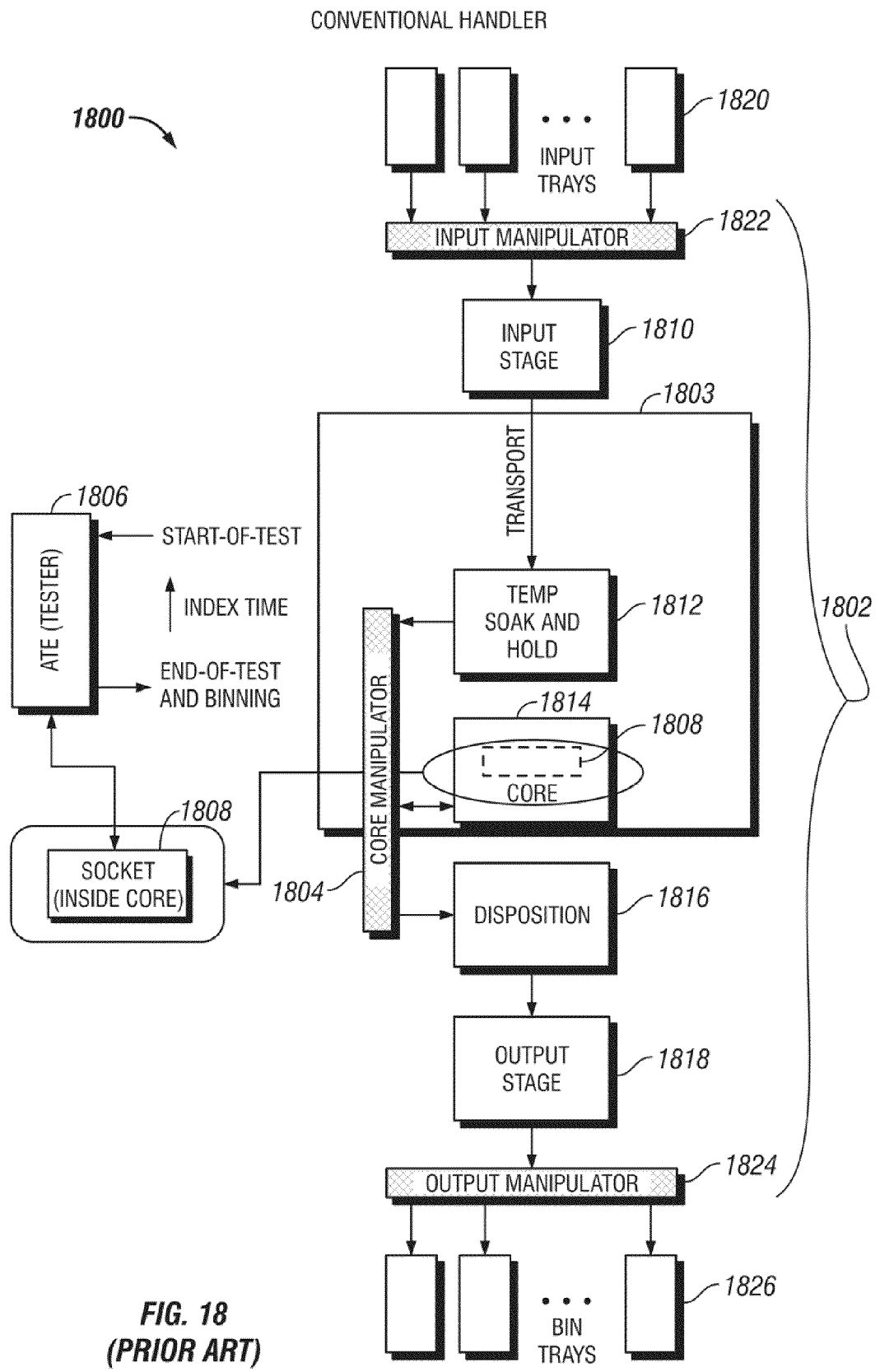
FIG. 18 illustrates a conventional test system, including a handler and single manipulator arm, a tester, a socket for the device under test, and other related features.

Referring to FIG. 17, a method 1700 performs testing via dual leads connected to a tester channel providing a set of test resources. In the method 1700, a first pin of a DUT (i.e., DUTA) is connected in a step 1702 to one of the leads, by a handler of a tester locating the DUTA in a test socket. The handler, in a step 1704, signals to the mux relay of the pin electronics card of the tester to switch testing to the one of the leads connecting the pin of DUTA. As the testing of DUTA is proceeding, the handler (as previously discussed, via another manipulator or as otherwise applicable) in a step 1706 (corresponding to the handler operations in the method 500, above) dispositions any device in another test socket of equivalent testing functionality, retrieves a next device (i.e., DUTB), and locates the DUTB in the other test socket. The DUTB is, therefore, generally already located in the other test socket at completion of the testing of DUTA.

The handler, in a step 1708, controls the muxing relay to switch testing to the other of the leads connecting the DUTB in the other test socket, upon completion of testing of the DUTA in the first test socket, and signals the tester to commence testing of DUTB. Testing of DUTB, via the tester channel and the lead connected to the single equivalent pin of the DUTB, proceeds in a step 1710.

During testing of DUTB, the handler next returns to the step 1702, by dispositioning the DUTA, placing the DUTA in a "test completed" location, retrieving a next device under test to replace the DUTA, and positioning this next device in the stead of the DUTA in the socket that held DUTA. The method 1700 continues until testing is completed for all devices, or until some other interrupting mechanism occurs (e.g., as previously mentioned, testing could be halted by an operator, because of error, etc.).

Exemplary Test System—Muxing Relays

Figure 19:
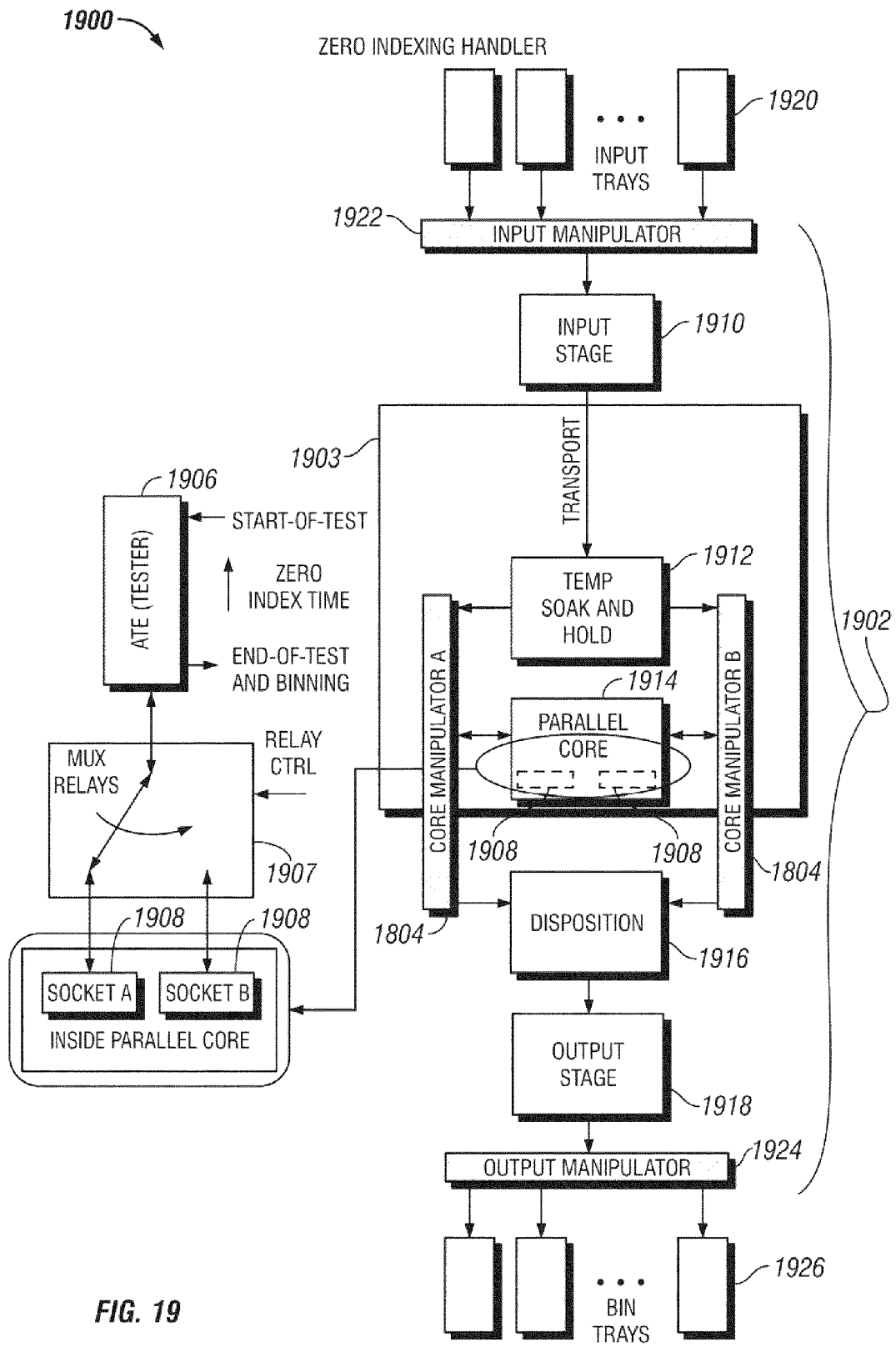
FIG. 19 illustrates a test system operable to achieve substantially negligible index time because of idle/inactive testing by the tester of the system, including a handler having dual manipulation arms of the test cell of the system, dual sockets for respective devices under test, and relays for switching test resources of the tester substantially immediately from one socket to the other socket for substantially immediate successive testing of respective devices under test pre-positioned in respective sockets to allow for testing by the tester with such immediate switching, according to certain embodiments of the invention.

Referring to FIG. 19, a test system 1900 for achieving reduced (i.e., negligible) index time includes a handler 1902 and a tester 1906. The handler 1902 includes a test cell 1903 comprising a parallel core 1014. The parallel core 1908 has dual sockets 1908 (A and B). The parallel core 1014 connects to mux relays 1907 connected to switch the tester resources on the tester channels between the dual sockets 1908, such that at any instant (other than substantially zero time required for signal switching via the relays 1907), the tester resources of the tester 1906 connect to one or the other of the dual sockets 1908. Operations of such mux relays 1907, in conjunction with the handler 1902 and the tester 1906, are as has just previously been described.

The handler 1902, similarly, includes elements that have been previously discussed, including dual core manipulators 1804. The dual core manipulators 1804 each posit/retain during test/disposit respective DUTs, such that while a DUT is being tested in one of the sockets 1908 as handled by one of the manipulators 1804, any DUT in the other socket 1908 and that has then been tested is dispositioned by the other of the manipulators 1804 and a next to-be-tested DUT retrieved and positioned in replacement. As has been explained, switching of the test resources of the tester 1906 occurs substantially immediately between the sockets 1908. Thus, at each instant one socket 1908 is testing the DUT therein, and the DUT in the other socket 1908 will have been tested and is being dispositioned and a next to-be-tested DUT positioned in the socket 1908 for immediate switch of testing thereto upon completion of the then-proceeding test of DUT in that other socket 1908.

The handler 1902 of the system 1900 includes other various mechanical (typically physically moving) conveyors/transports and robotic manipulation arms for input and output staging of DUTs as has been described. Input trays 1920 hold DUTs for pick-up by an input manipulator arm 1922 and location at an input stage 1910 for the test cell 1903. Each DUT at the input stage 1910 progresses, for example by transport mechanism or the like, to a temp soak and hold stage 1912 (as applicable). One of the dual manipulator arms 1908 retrieves the DUT (according to the particular one of the sockets 1908 available for the DUT) and positions the DUT in the applicable available one of the sockets 1908. As described, the retrieving and positioning of the DUT occurs as testing by the tester 1906 is performed on any DUT in the other of the sockets 1908 at that time. Once the tester resources are switched by the mux relays 1907, i.e., substantially immediately upon completion of test of that DUT in the other of the sockets 1908, the tester resources stimulate the then-so positioned DUT. The other manipulator arm 1904 for the DUT and socket 1908 as to which the test has been completed and from which test resources are just switched, proceeds to disposition that DUT from that socket 1908, transfer the DUT to a disposition stage (as has been discussed), and then retrieve and locate a next to-be-tested DUT in replacement (during the other DUT test, etc.).

Other elements of the handler 1902 for the particular testing operation—such as, for pre- and post-test progression include output transport mechanisms, an output stage 1918 (corresponding to test result or otherwise), an output manipulator arm 1924 for transfer from the output stage 1918 and placement of each tested DUT in respective, applicable ones of bin trays 1926.

Testing by the system 1900 progresses as to each next to-be-tested DUT (from among remaining ones of the DUTs staged as input for testing) in continuing manners. Via the system 1900, because of the handler 1902 with dual manipulator arms 1904 and dual sockets 1908 of the parallel core 1908, and also because of the immediate switching of test resources of the tester 1906 from one of the dual sockets 1908 to the other for substantially continuous testing as to successive ones of the dual sockets 1908 and DUTs thereat, virtually eliminates index time in testing.

Tandem Handler and Combination with Muxing Relay

Figure 20:
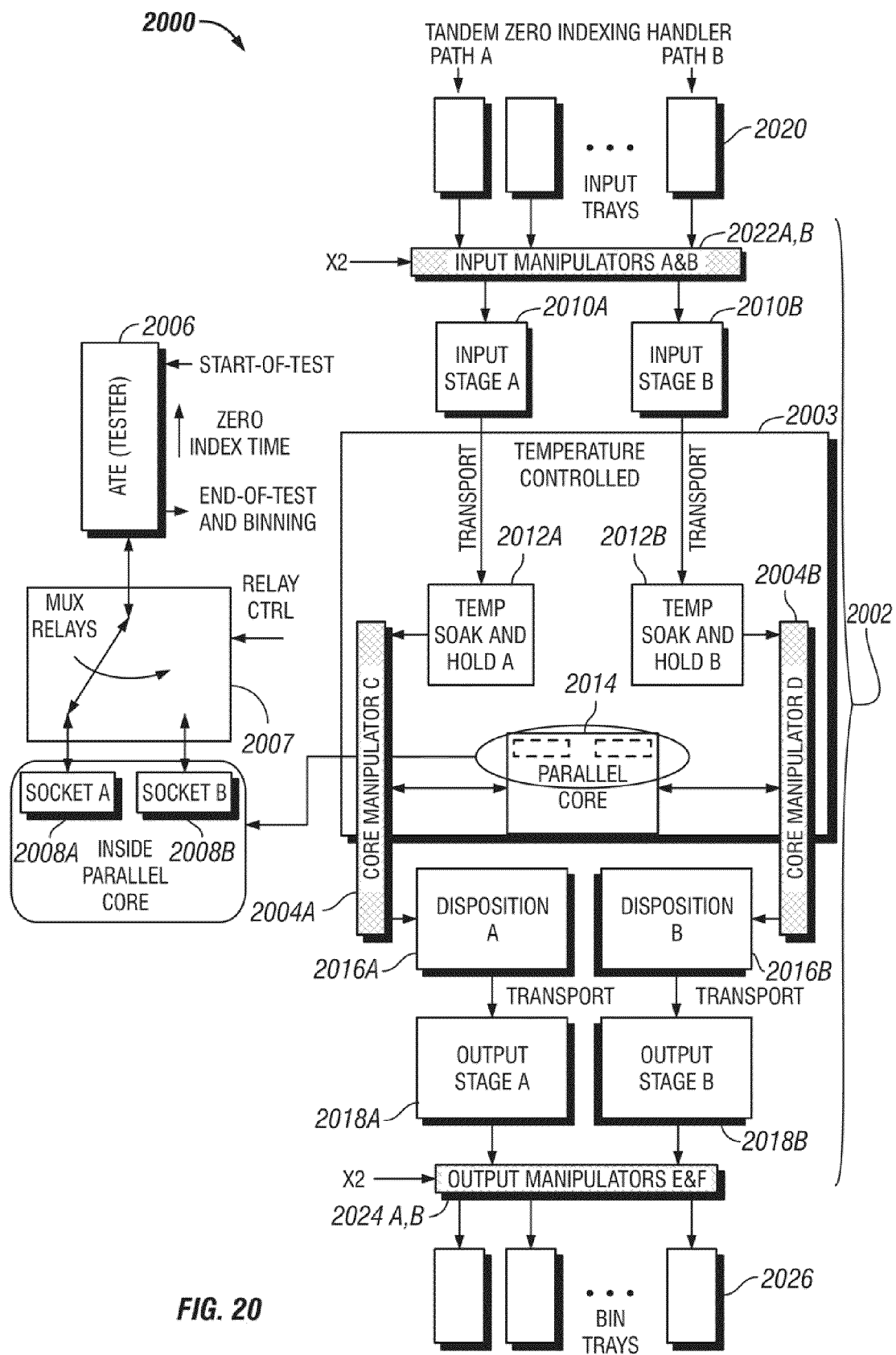
FIG. 20 illustrates a test system operable to also achieve substantially negligible index time, as well as downtime reduction and other advantages, including respective test cells of dual testing paths of a tandem handler (for example, incorporated as a single handler unit), having dual manipulator arms, and at least certain features/stages and transport elements for the respective dual testing paths, and further including dia; sockets for respective devices under test to allow immediate switching of tester resources of the tester between the sockets, for reduced (substantially negligible) index time and tandem handling in the system, according to certain embodiments of the invention.

Referring to FIG. 20, a tandem handler 2000 connected to a tester 2006, includes dual mechanical progression paths for DUTs, i.e., the handler 2000 provides a test cell 2003 having separate respective elements and mechanisms for providing at least certain duality of stages along test paths for respective DUTs. Certain electronics and mechanical elements of the handler 2000 are common and employed by/for operations of both of the dual paths. In particular, the handler 1900 generally includes a path A and path B for progression of respective DUTs through handler test processing. The handler 2000, however, has a parallel core 2014 with dual sockets 2008A,B for respective DUT, as has been described. The handler 2000 also includes a first core manipulator arm 1904A and a second core manipulator arm 1904B, corresponding to the respective paths and operations along the paths (or otherwise coordinated for the paths). Each of the first and second core manipulator arm 1904A,B is controlled by the handler 2000 via primarily common circuitry and logic, but each has independent elements for applicable mechanical and other operations of the handler 2000 as to the respective paths A,B. Mux relays 2007 switchably connect the tester resources of the tester 2006 to respective ones of the dual sockets 2008A,B for testing at one or the other of the sockets 2008A,B at each instant of operations.

The tandem handler 2002, in the example of FIG. 20, has several respective elements for each of the dual progression paths, including first and second of each of input stages 2010A,B, temp soak and hold stages 2012A,B, disposition stages 2016A,B, and output stages 2018A,B. Common elements of the dual paths can include, for example, input trays 2020 and bin trays 2026 and/or other aspects. In any event, the tandem handler 2000 has (or can have) certain common elements that do or may be utilized because of any of a wide variety of reasons (including, for example, economics/expense, spatial arrangements, testing requirements, engineering limitations/practices, and practical or other reasons), with a view to maintaining advantageous negligible (or substantially reduced) index time, downtime, or other concern that would undesirably stall active testing in operations of the tester 2006 via the switching mux relays 2007 and parallel core 2014/dual sockets 2008A,B arrangement.

Certain elements of the tandem handler 2002 are not common to the paths A,B for respective DUT progression through the test cell 2003, and these elements similarly can/will/may be dictated by economic, spatial, engineering, design, operational or other requirements, practicalities, functionalities or other considerations. The advantages from negligible index time achieved via the arrangement and reduced downtime and other factors will be understood and realized via the tandem handler 2002 and other aspects of the system 2000. In FIG. 20, the system 2000 includes dual input manipulators 2022A,B for pick-up of next DUT from input trays 2020 and location at respective input stages A,B. Transport and similar mechanisms are also segregated as to each of the input stages A,B and paths A,B. Separate temp soak and hold stages A,B and separate disposition stages A,B correspond to respective test paths A,B of test cell 2003 of the tandem handler 2002. Similarly, output transport and mechanisms and dual output manipulators 2024A,B progress each next DUT on completion of testing (as per the test result and arrangement) as to output staging and to output bin trays 2026 and the like.

More particularly as to the tandem handler 2002 of FIG. 20, operating in conjunction with the muxing relays 2007 switchably connecting the tester resources of the tester 2006 and respective dual sockets 2008A,B of the parallel core 2014, each of the dual core manipulator arms 2004A,B operates in sequence similarly as described above regarding the parallel core 2014 and dual sockets 2008A,B for respective DUTs and switchable relay of test resources. In the operation, the tandem handler 2002, via the dual manipulator arms 2004A,B and the respective sockets 2008A,B of the parallel core 2014, positions for testing, maintains for testing, and dispositions after testing a DUT(a) along path A and a DUT(b) along path B in succession. When the DUT(a) is positioned (via one of the core manipulators 2004A) in a respective one of the sockets 2008A and testing occurs, the DUT(b) is retrieved and positioned (via the other of the core manipulators 2004B) in the other of the sockets 2008B (e.g., in replacement for any prior device therein that has then been tested and dispositioned therefrom by the core manipulator 2004B). Upon completion of testing of DUT(a), the tandem handler 2002, as response to a test result/end of test signal of the tester 2006 (or otherwise controlled or triggered), controls the mux relays 2007 to switch test resources of the tester 2006 to testing of DUT(b). Control logic for operations of the tandem handler 2002, and resulting controls/operations of other aspects of the system 2000, is provided by software, hardware, or combinations, as previously addressed.

Additionally, at completion of testing of DUT(a), the tandem handler 2002, concurrently with the switching of testing to DUT(b) via the mux relays 2007, dispositions the DUT(a) by means of the core manipulator 2004A and thereby locates DUT(a) in corresponding disposition stage 2016A for output from the system 2000. Upon so locating the then-tested DUT (a) for output, the core manipulator 2004A retrieves a next to-be-tested DUT(a) (e.g., at the temp soak and hold stage 2012A) and positions this next DUT(a) in the applicable vacant socket 2008A. Simultaneously, the tester resources stimulate the DUT(b) in the socket 2008B in accordance with tester 2006 protocols for the test and tester resources thereof Substantially immediately on completion of testing of the DUT(b) in the socket 2008B, the mux relays 2007 switch test resources of the tester 2006 back again to the socket 2008 holding the DUT(a) (e.g., because of test result/end of test as to the DUT(b) and handler 2002 response/control). At the completion of this testing of DUT(b) in the socket 2008B, the tandem handler 2002, concurrently with the switching of testing back to DUT(a) via the mux relays 2007, dispositions the then-tested DUT(b) by means of the core manipulator 2004B and thereby locates the DUT(b) in corresponding disposition stage 2016B for output from the system 2000. The dual test paths A,B of the tandem handler 2002 of the system 2000, as so operable together with the tester 2006 and switching of test resources via the mux relays 2007 from one to the next of the dual sockets 2008A,B, coupled with the operations of the successive disposition/retrieve/position/test then repeat operations via the dual core manipulators 2004A,B in their separate successive and repeated operations, continues testing until all DUTs staged as input for testing are tested (or until some interruption inconsistent with continuation occurs).

The tandem handler 2002 as implemented in the system 2000, thus, further limits/reduces occurrence of downtime and index time in testing operations. For example, if any aspect/element of either test path A,B fails, or is shut down during maintenance, repair or the like, the tandem handler 2002 continues test cell progression of each next DUT for pre-test, test by the tester 2006, and post-test. If either of the core manipulator arms 2004A,B is cause of fault or shutdown, in an instance, the other of the arms 2004B,A nonetheless is capable of continued operations for next DUT testing. Each next DUT can be tested along either a single of the paths A,B, as available/operable, or depending on features and control logic of the tandem handler 2002, in accordance with optimized test sequencing in such event.

Thus, in the foregoing, the combination in the system 2000, of the switching of tester resources of the tester 2006 via the mux relays 2007 between the dual sockets 2008A,B and the dual paths A,B for testing operations of the various elements of the tandem handler 2002, provides for both reduced index time and reduced down time, as well as wide latitude and variation of possibilities/options/configurations for programming, control and sequencing of test and testing operations; event, failure and error response; design and arrangement alternatives for economic, engineering or other optimization or grounds, and otherwise. Additionally, further and other advantages and improvements are realized in the embodiments and aspects thereof.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of testing, comprising:
    first manipulating a to-be-tested device (TBTD) of a plurality of TBTDs, via a first robot, into connection with a first pin stimulatable by a test resource of a tester;
    first controlling the tester to connect the test resource to the first pin and commence a test by the tester at the first pin on the TBTD connected to the first pin;
    second manipulating another TBTD of the plurality of TBTDs, via a second robot, into connection with a second pin stimulatable by the test resource of the tester;
    second controlling the tester to connect the test resource to the second pin and commence the test by the tester at the second pin on the TBTD connected to the second pin; and
    master controlling to perform at least part of the first manipulating as to each next successive TBTD of the plurality of TBTDs during test by the tester at the second pin, to perform the second controlling upon completion of test by the tester at the first pin, to perform at least part of the second manipulating as to each next successive TBTD of the plurality of TBTDs during test by the tester at the first pin, and to perform the first controlling upon completion of test by the tester at the second pin,
    wherein the first controlling commences immediately upon completion of the test by the tester at the second pin.

2. The method of claim 1, further comprising:
    first mechanically prepping each successive TBTD that is to be connected to the first pin, prior to connection to the first pin via the first manipulating and prior to the first controlling corresponding to the TBTD to be so connected;
    second mechanically prepping each successive TBTD that is to be connected to the second pin, prior to connection to the second pin via the second manipulating and prior to the second controlling corresponding to the TBTD to be so connected;
    first mechanically outputting each successive TBTD connected to the first pin, after completion of test by the tester resource at the first pin; and
    second mechanically outputting each successive TBTD connected to the second pin, after completion of test by the tester at the second pin.

3. The method of claim 2,
wherein the first robot and the second robot are not the same.

4. The method of claim 3,
wherein the first robot and the second robot are mechanically connected and controlled by common logic.

5. The method of claim 4,
wherein the first mechanically outputting is performed by a first output robot and the second mechanically outputting is performed by a second output robot,
wherein the first output robot and the second output robot are mechanically connected and controlled by common logic; and
wherein each of the first robot and the second robot are mechanically connected to the first output robot and the second output robot, and controlled by the common logic.

6. The method of claim 5,
wherein the first robot and the second robot are each selected from a group consisting of a transport, a preparer, a test unit and a manipulator, and
wherein the first output robot and the second output robot are each selected from a group consisting of an output transport, an output stager, an output test unit, and an output manipulator.

7. The method of claim 6,
wherein the first robot and the second robot are each a respective core manipulator of a handler connected to the tester.

8. The method of claim 5,
wherein the first robot and the second robot are each selected from a group comprising of a transport, a preparer, a test unit and a manipulator, and
wherein the first output robot and the second output robot are each selected from a group comprising of an output transport, an output stager, an output test unit, and an output manipulator.

9. The method of claim 3,
wherein the first mechanically outputting is performed by a first output robot and the second mechanically outputting is performed by a second output robot, and
wherein the first output robot and the second output robot are mechanically connected and controlled by common logic.

10. The method of claim 1,
wherein the testing continues when one of the first robot and the second robot becomes inoperable.

11. A non-transitory computer-readable storage medium including a computer-executable program for implementing a process, comprising:
first manipulating a to-be-tested device (TBTD) of a plurality of TBTDs, via a first robot, into connection with a first pin stimulatable by a test resource of a tester;
first controlling the tester to connect the test resource to the first pin and commence a test by the tester at the first pin on the TBTD connected to the first pin;
second manipulating another TBTD of the plurality of TBTDs, via a second robot, into connection with a second pin stimulatable by the test resource of the tester;
second controlling the tester to connect the test resource to the second pin and commence the test by the tester at the second pin on the TBTD connected to the second pin; and
master controlling to perform at least part of the first manipulating as to each next successive TBTD of the plurality of TBTDs during test by the tester at the second pin, to perform the second controlling upon completion of test by the tester at the first pin, to perform at least part of the second manipulating as to each next successive TBTD of the plurality of TBTDs during test by the tester at the first pin, and to perform the first controlling upon completion of test by the tester at the second pin,
wherein the first controlling commences immediately upon completion of the test by the tester at the second pin.

* * * * *